US008115988B2

(12) United States Patent
Chui et al.

(10) Patent No.: US 8,115,988 B2
(45) Date of Patent: Feb. 14, 2012

(54) SYSTEM AND METHOD FOR MICRO-ELECTROMECHANICAL OPERATION OF AN INTERFEROMETRIC MODULATOR

(75) Inventors: Clarence Chui, San Mateo, CA (US); William J Cummings, Milbrae, CA (US); Brian J Gally, Los Gatos, CA (US); Ming-Hau Tung, San Francisco, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 587 days.

(21) Appl. No.: 12/241,600

(22) Filed: Sep. 30, 2008

(65) Prior Publication Data

US 2009/0022884 A1 Jan. 22, 2009

Related U.S. Application Data

(60) Division of application No. 11/189,690, filed on Jul. 26, 2005, now Pat. No. 7,567,373, which is a continuation-in-part of application No. 11/048,662, filed on Jan. 27, 2005, now abandoned, and a continuation-in-part of application No. 10/909,228, filed on Jul. 29, 2004, now abandoned.

(60) Provisional application No. 60/613,466, filed on Sep. 27, 2004, provisional application No. 60/613,499, filed on Sep. 27, 2004, provisional application No. 60/658,867, filed on Mar. 4, 2005.

(51) Int. Cl.
*G02B 26/00* (2006.01)

(52) U.S. Cl. ..................................... 359/291

(58) Field of Classification Search ............. 359/291, 359/292, 295, 220, 223, 224, 320, 324; 438/381, 438/396, 397, 652
See application file for complete search history.

(56) References Cited

U.S. PATENT DOCUMENTS

| 4,190,488 A | 2/1980 | Winters |
| 4,498,953 A | 2/1985 | Cook et al. |

(Continued)

FOREIGN PATENT DOCUMENTS

CN 1378245 11/2002

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner* — Ricky Mack
*Assistant Examiner* — Tuyen Tra
(74) *Attorney, Agent, or Firm* — Knobbe Martens Olson & Bear LLP

(57) ABSTRACT

An interferometric modulator is formed by a stationary layer and a mirror facing the stationary layer. The mirror is movable between the undriven and driven positions. Landing pads, bumps or spring clips are formed on at least one of the stationary layer and the mirror. The landing pads, bumps or spring clips can prevent the stationary layer and the mirror from contacting each other when the mirror is in the driven position. The spring clips exert force on the mirror toward the undriven position when the mirror is in the driven position and in contact with the spring clips.

30 Claims, 27 Drawing Sheets

U.S. PATENT DOCUMENTS

| | | |
|---|---|---|
| 4,500,171 A | 2/1985 | Penz et al. |
| 4,519,676 A | 5/1985 | te Velde |
| 4,560,435 A | 12/1985 | Brown et al. |
| 4,566,935 A | 1/1986 | Hornbeck |
| 4,710,732 A | 12/1987 | Hornbeck |
| 4,880,493 A | 11/1989 | Ashby et al. |
| 4,900,395 A | 2/1990 | Syverson et al. |
| 4,954,789 A | 9/1990 | Sampsell |
| 4,956,619 A | 9/1990 | Hornbeck |
| 5,083,857 A | 1/1992 | Hornbeck |
| 5,099,353 A | 3/1992 | Hornbeck |
| 5,124,834 A | 6/1992 | Cusano et al. |
| 5,190,637 A | 3/1993 | Guckel |
| 5,216,537 A | 6/1993 | Hornbeck |
| 5,231,532 A | 7/1993 | Magel et al. |
| 5,293,272 A | 3/1994 | Jannson et al. |
| 5,324,683 A | 6/1994 | Fitch et al. |
| 5,345,328 A | 9/1994 | Fritz et al. |
| 5,358,806 A | 10/1994 | Haraichi et al. |
| 5,381,040 A | 1/1995 | Sun et al. |
| 5,454,906 A | 10/1995 | Baker et al. |
| 5,559,358 A | 9/1996 | Burns et al. |
| 5,583,688 A | 12/1996 | Hornbeck |
| 5,646,768 A | 7/1997 | Kaeiyama |
| 5,656,554 A | 8/1997 | Desai et al. |
| 5,683,649 A | 11/1997 | Chatterjee et al. |
| 5,690,839 A | 11/1997 | Min |
| 5,719,068 A | 2/1998 | Suzawa et al. |
| 5,726,480 A | 3/1998 | Pister |
| 5,784,212 A | 7/1998 | Hornbeck |
| 5,801,084 A | 9/1998 | Beasom et al. |
| 5,822,110 A | 10/1998 | Dabbaj |
| 5,825,528 A | 10/1998 | Goossen |
| 5,835,255 A | 11/1998 | Miles |
| 5,967,163 A | 10/1999 | Pan et al. |
| 5,986,796 A | 11/1999 | Miles |
| 6,008,123 A | 12/1999 | Kook et al. |
| 6,031,653 A | 2/2000 | Yu |
| 6,040,937 A | 3/2000 | Miles |
| 6,046,659 A | 4/2000 | Loo et al. |
| 6,097,145 A | 8/2000 | Kastalsky et al. |
| 6,162,657 A | 12/2000 | Schiele et al. |
| 6,165,890 A | 12/2000 | Kohl et al. |
| 6,195,196 B1 | 2/2001 | Kimura et al. |
| 6,204,080 B1 | 3/2001 | Hwang |
| 6,215,221 B1 | 4/2001 | Cabuz et al. |
| 6,248,654 B1 | 6/2001 | Lee et al. |
| 6,288,472 B1 | 9/2001 | Cabuz et al. |
| 6,297,072 B1 | 10/2001 | Tilmans et al. |
| 6,319,824 B1 | 11/2001 | Lee et al. |
| 6,337,027 B1 | 1/2002 | Humphrey |
| 6,342,452 B1 | 1/2002 | Coronel et al. |
| 6,359,673 B1 | 3/2002 | Stephenson |
| 6,376,787 B1 * | 4/2002 | Martin et al. ............... 200/181 |
| 6,377,233 B2 | 4/2002 | Colgan et al. |
| 6,407,851 B1 | 6/2002 | Islam et al. |
| 6,447,126 B1 | 9/2002 | Hornbeck |
| 6,448,622 B1 | 9/2002 | Franke et al. |
| 6,465,320 B1 | 10/2002 | McNeil et al. |
| 6,574,033 B1 | 6/2003 | Chui et al. |
| 6,602,791 B2 | 8/2003 | Ouellet et al. |
| 6,618,187 B2 | 9/2003 | Pilossof |
| 6,620,712 B2 | 9/2003 | Huang et al. |
| 6,635,919 B1 | 10/2003 | Melendez et al. |
| 6,666,979 B2 | 12/2003 | Chinn et al. |
| 6,674,090 B1 | 1/2004 | Chua et al. |
| 6,674,562 B1 | 1/2004 | Miles |
| 6,689,211 B1 | 2/2004 | Wu et al. |
| 6,713,235 B1 | 3/2004 | Ide et al. |
| 6,720,267 B1 | 4/2004 | Chen et al. |
| 6,747,800 B1 | 6/2004 | Lin |
| 6,756,317 B2 | 6/2004 | Sniegowski et al. |
| 6,778,306 B2 | 8/2004 | Sniegowski et al. |
| 6,782,166 B1 | 8/2004 | Grote et al. |
| 6,794,119 B2 | 9/2004 | Miles |
| 6,806,110 B2 | 10/2004 | Lester et al. |
| 6,812,482 B2 | 11/2004 | Fleming et al. |
| 6,849,471 B2 | 2/2005 | Patel et al. |
| 6,861,277 B1 | 3/2005 | Monroe et al. |
| 6,867,896 B2 | 3/2005 | Miles |
| 6,870,654 B2 | 3/2005 | Lin et al. |
| 6,872,319 B2 | 3/2005 | Tsai |
| 6,905,613 B2 | 6/2005 | Gutierrez et al. |
| 6,913,942 B2 | 7/2005 | Patel et al. |
| 6,951,824 B2 | 10/2005 | Fischer et al. |
| 6,952,303 B2 | 10/2005 | Lin et al. |
| 6,953,702 B2 | 10/2005 | Miller et al. |
| 6,960,305 B2 | 11/2005 | Doan et al. |
| 6,972,891 B2 | 12/2005 | Patel et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,008,812 B1 | 3/2006 | Carley |
| 7,012,726 B1 | 3/2006 | Miles |
| 7,027,202 B1 | 4/2006 | Hunter et al. |
| 7,041,224 B2 | 5/2006 | Patel et al. |
| 7,041,571 B2 | 5/2006 | Strane |
| 7,049,164 B2 | 5/2006 | Bruner |
| 7,072,093 B2 | 7/2006 | Piehl et al. |
| 7,078,293 B2 | 7/2006 | Lin et al. |
| 7,110,158 B2 | 9/2006 | Miles |
| 7,119,945 B2 | 10/2006 | Cummings et al. |
| 7,123,216 B1 | 10/2006 | Miles |
| 7,172,915 B2 | 2/2007 | Lin et al. |
| 7,183,637 B2 | 2/2007 | Bruner |
| 7,198,973 B2 | 4/2007 | Lin et al. |
| 7,202,101 B2 | 4/2007 | Gabriel et al. |
| 7,221,495 B2 | 5/2007 | Miles et al. |
| 7,256,107 B2 | 8/2007 | Takeuchi et al. |
| 7,265,019 B2 * | 9/2007 | Chinthakindi et al. ....... 438/381 |
| 7,291,921 B2 | 11/2007 | Lin |
| 7,459,402 B2 | 12/2008 | Doan et al. |
| 7,952,789 B2 | 5/2011 | Tung et al. |
| 2001/0003487 A1 | 6/2001 | Miles |
| 2002/0003400 A1 | 1/2002 | Lee |
| 2002/0014579 A1 | 2/2002 | Dunfield |
| 2002/0015215 A1 | 2/2002 | Miles |
| 2002/0021485 A1 | 2/2002 | Pilossof |
| 2002/0027636 A1 | 3/2002 | Yamada |
| 2002/0055253 A1 | 5/2002 | Rudhard |
| 2002/0086455 A1 | 7/2002 | Franosch et al. |
| 2002/0110948 A1 | 8/2002 | Huang et al. |
| 2002/0117728 A1 | 8/2002 | Brosnihan et al. |
| 2002/0155717 A1 | 10/2002 | Sniegowski et al. |
| 2003/0003682 A1 | 1/2003 | Moll et al. |
| 2003/0003761 A1 | 1/2003 | Yang et al. |
| 2003/0006468 A1 | 1/2003 | Ma et al. |
| 2003/0029831 A1 | 2/2003 | Kawase |
| 2003/0047533 A1 | 3/2003 | Reid et al. |
| 2003/0071015 A1 | 4/2003 | Chinn et al. |
| 2003/0072070 A1 | 4/2003 | Miles |
| 2003/0111439 A1 | 6/2003 | Fetter et al. |
| 2003/0138986 A1 | 7/2003 | Bruner |
| 2003/0141561 A1 | 7/2003 | Fischer et al. |
| 2003/0202264 A1 | 10/2003 | Weber et al. |
| 2003/0202265 A1 | 10/2003 | Reboa et al. |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0053434 A1 | 3/2004 | Bruner |
| 2004/0080832 A1 | 4/2004 | Singh |
| 2004/0124483 A1 | 7/2004 | Partridge et al. |
| 2004/0124495 A1 | 7/2004 | Chen et al. |
| 2004/0132243 A1 | 7/2004 | Kurosawa et al. |
| 2004/0136076 A1 | 7/2004 | Tayebati |
| 2004/0159629 A1 | 8/2004 | Busta |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0207898 A1 | 10/2004 | Lin et al. |
| 2004/0209195 A1 | 10/2004 | Lin |
| 2004/0217264 A1 | 11/2004 | Wood et al. |
| 2004/0244191 A1 | 12/2004 | Orr et al. |
| 2005/0014374 A1 | 1/2005 | Partridge et al. |
| 2005/0020089 A1 | 1/2005 | Shi et al. |
| 2005/0034822 A1 | 2/2005 | Kim et al. |

| | | | |
|---|---|---|---|
| 2005/0045276 A1 | 3/2005 | Patel et al. | |
| 2005/0098840 A1 | 5/2005 | Fuertsch et al. | |
| 2005/0118832 A1 | 6/2005 | Korzenski et al. | |
| 2005/0124135 A1 | 6/2005 | Ayazi et al. | |
| 2005/0170670 A1 | 8/2005 | King et al. | |
| 2005/0195462 A1 | 9/2005 | Lin | |
| 2005/0226281 A1 | 10/2005 | Faraone et al. | |
| 2005/0266599 A1 | 12/2005 | Ikegami | |
| 2006/0066932 A1 | 3/2006 | Chui | |
| 2006/0256420 A1 | 11/2006 | Miles et al. | |
| 2006/0257070 A1 | 11/2006 | Lin et al. | |
| 2007/0111533 A1 | 5/2007 | Korzenski et al. | |
| 2007/0269748 A1 | 11/2007 | Miles | |
| 2008/0026328 A1 | 1/2008 | Miles | |
| 2009/0323168 A1 | 12/2009 | Miles et al. | |
| 2010/0320555 A1 | 12/2010 | Miles et al. | |

FOREIGN PATENT DOCUMENTS

| | | |
|---|---|---|
| DE | 199 38 072 | 3/2000 |
| EP | 0 035 299 | 9/1983 |
| EP | 0 788 005 | 8/1997 |
| EP | 1 209 738 | 5/2002 |
| EP | 1 452 481 | 9/2004 |
| EP | 1 473 691 | 11/2004 |
| FR | 2824643 | 10/1999 |
| JP | 49-004993 | 1/1974 |
| JP | 01-102415 | 4/1989 |
| JP | 05275401 | 10/1993 |
| JP | 06-350105 | 12/1994 |
| JP | 07-098326 | 4/1995 |
| JP | 07-060844 | 7/1995 |
| JP | 10-020328 | 1/1998 |
| JP | 10-148644 | 6/1998 |
| JP | 10-209176 | 8/1998 |
| JP | 11211999 A | 8/1999 |
| JP | 11-258777 | 9/1999 |
| JP | 2001-085519 | 3/2001 |
| JP | 2002-287047 | 3/2001 |
| JP | 2002-207182 | 7/2002 |
| JP | 2002-243937 | 8/2002 |
| JP | 2002-328313 | 11/2002 |
| JP | 2003-001598 | 1/2003 |
| JP | 2003-340795 | 12/2003 |
| JP | 2004-106074 | 4/2004 |
| JP | 2004-133281 | 4/2004 |
| JP | 2005-028504 | 3/2005 |
| JP | 2005-193336 | 7/2005 |
| TW | 546833 | 8/2003 |
| WO | WO 91/05284 | 4/1991 |
| WO | WO 92/10925 | 6/1992 |
| WO | WO 98/29748 | 7/1998 |
| WO | WO 99/52006 | 10/1999 |
| WO | WO 01/14248 | 3/2001 |
| WO | WO 01/63657 | 8/2001 |
| WO | WO 02/24570 | 3/2002 |
| WO | WO 02/075803 | 9/2002 |
| WO | WO 03/017653 | 2/2003 |
| WO | WO 03/107094 | 12/2003 |
| WO | WO 2004/003981 | 1/2004 |
| WO | WO 2004/055885 | 7/2004 |
| WO | WO 2004/079056 | 9/2004 |
| WO | WO 2004/087561 | 10/2004 |
| WO | WO 2005/061378 | 7/2005 |
| WO | WO 2006/113492 | 10/2006 |

OTHER PUBLICATIONS

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.
Ibbotson et al., "Comparison of XeF2 and F-atom reactions with Si and SiO2," Applied Physics Letters, vol. 44, No. 12, pp. 1129-1131 (Jun. 1984).
Jerman J. H. et al., "Miniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Raley et al., "A Fabry-Perot Microinterferometer for Visible Wavelengths," IEEE Solid-State Sensor and Actuator Workshop, Hilton Head, SC, pp. 170-173 (1992).
Williams, et al. Etch Rates for Micromachining Processing. Journal of Microelectromechanical Systems, vol. 5, No. 4, pp. 256-259, (Dec. 1996).
Winters, et al. The etching of silicon with XeF2 vapor. Applied Physics Letters, vol. 34, No. 1, pp. 70-73, (Jan. 1979).
Official Communication dated Jun. 1, 2007, in European App. No. 05775273.5.
Official Communication dated Jul. 25, 2007, in European App. No. 05775273.5.
Extended Search Report for European App. No. 07011319.6, dated Jun. 27, 2008.
Sridharan et al. "Post-packaging Release a New Concept for Surface-Micromachined Devices" Technical Digest, IEEE Solid-State Sensor & Actuator Workshop, New York, NY US Nov. 8, 1998 pp. 225-228.
Yao et al., BrF3 dry release technology for large freestanding parylene microstructures and electrostatic actuators, Sensors and Actuators A, vol. 97-98, pp. 771-775, Apr. 2002.
Office Action dated Aug. 2, 2007 in U.S. Appl. No. 11/189,690.
Office Action dated Jan. 29, 2007 in U.S. Appl. No. 11/189,690.
IPRP for PCT/US05/026448 filed Jul. 25, 2007.
ISR and WO for PCT/US05/026448 filed Jul. 25, 2007.
Boucinha et al., 2000, Amorphous silicon air-gap resonators on large-area substrates, Applied Physics Letters, 77(6):907-909.
Rusu et al., 2001, Planarization of deep trenches, Proc. SPIE, 4557:49-57.
Williams et al., Dec. 2003, Etch rates for micromachining processing—part II, Journal of Microelectromechanical Systems, 12(6):761-778.
Official Communication dated Mar. 4, 2011, in European App. No. 05775273.5.
European Search Report issued in the corresponding European Patent Application No. 10173199.0 dated Oct. 29, 2010.
Hurych et al., *Influence of non-uniform thickness of dielectric layers on Capacitance and Tunnel Currents*. Solid—State Electronics, Pergamon Press, 1966. vol. 9, pp. 967-979.

* cited by examiner

|  | Column Output Signals | |
|---|---|---|
|  | $+V_{bias}$ | $-V_{bias}$ |
| Row Output Signals   0 | Stable | Stable |
| +DV | Relax | Actuate |
| -DV | Actuate | Relax |

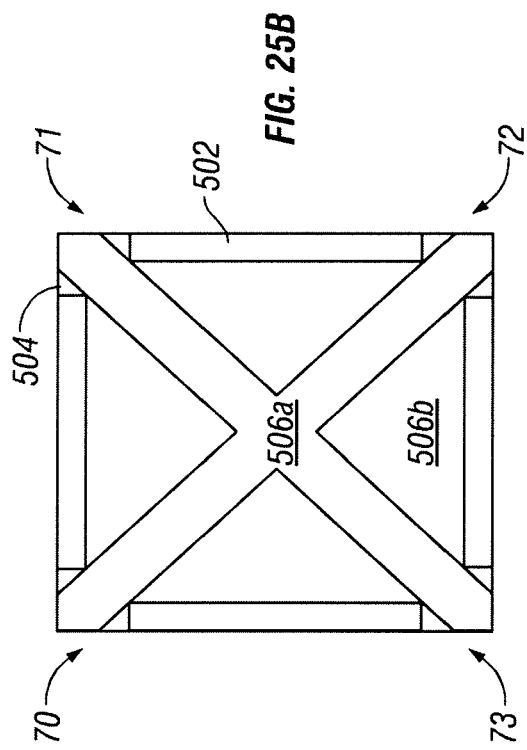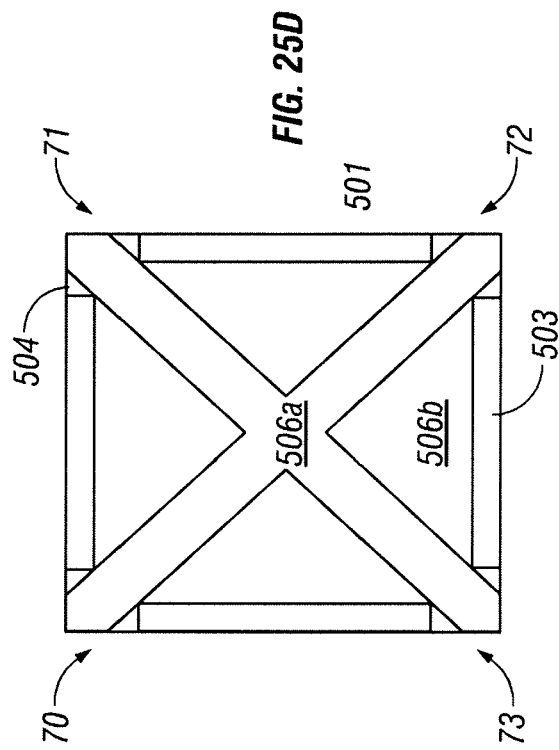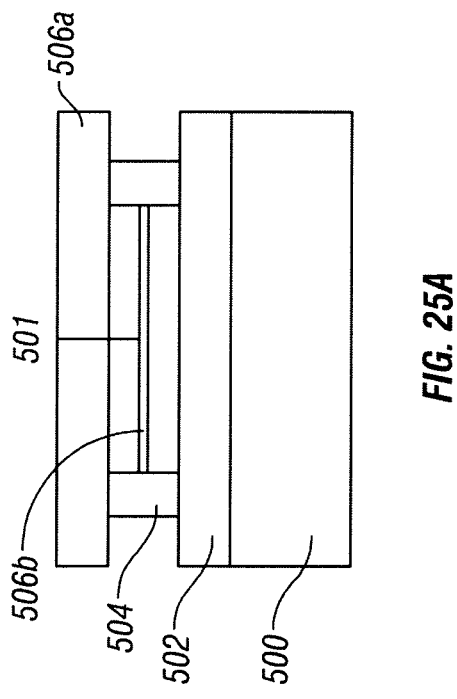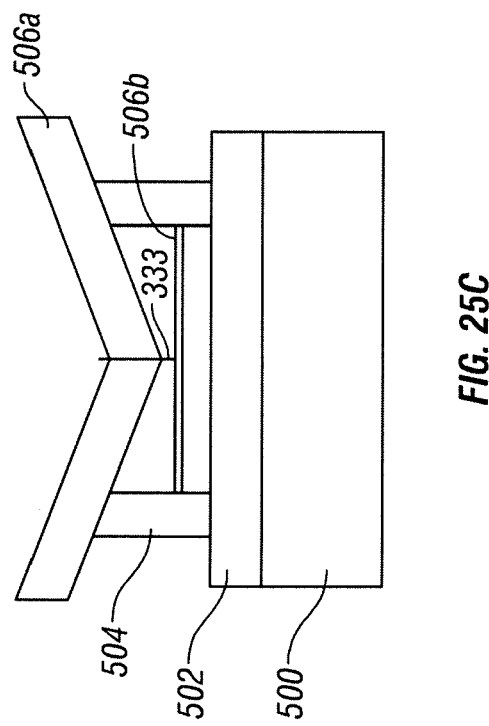

SYSTEM AND METHOD FOR MICRO-ELECTROMECHANICAL OPERATION OF AN INTERFEROMETRIC MODULATOR

CROSS-REFERENCE TO RELATED APPLICATIONS

This application is a divisional of U.S. application Ser. No. 11/189,690, filed Jul. 26, 2005, which issued as U.S. Pat. No. 7,567,373 on Jul. 28, 2009 and is hereby incorporated by reference in its entirety. U.S. application Ser. No. 11/189,690 is a continuation-in-part of the following: U.S. application Ser. No. 10/909,228, filed Jul. 29, 2004, now abandoned; and U.S. application Ser. No. 11/048,662, filed Jan. 27, 2005, now abandoned; both of which are hereby incorporated by reference in their entireties. U.S. application Ser. No. 11/189,690 also claims priority to the following: U.S. Provisional Application No. 60/613,466, filed Sep. 27, 2004; U.S. Provisional Application No. 60/613,499, filed Sep. 27, 2004; and U.S. Provisional Application No. 60/658,867, filed Mar. 4, 2005; all of which are hereby incorporated herein by reference in their entireties.

BACKGROUND

1. Field of the Invention

This invention relates to microelectromechanical systems for use as interferometric modulators. More particularly, this invention relates to systems and methods for improving the micro-electromechanical operation of interferometric modulators.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect of the invention provides an interferometric modulator, which includes a first layer, a second layer and a member. The first layer includes a first reflective planar portion. The second layer includes a second reflective planar portion located substantially parallel to the first reflective planar portion. The second layer is movable between a first position and a second position. The first position is located at a first distance from the first layer. The second position is located at a second distance from the first layer. The second distance is greater than the first distance. The member includes a surface that is located between the first layer and second layer. The member defines one or more gap regions between the first layer and the second layer when the second layer is in the first position, wherein the second layer in the one or more gap regions does not contact either the first layer or the member.

Another aspect of the invention provides a microelectromechanical device, which includes a first surface, a second surface and a third surface. The second surface is located substantially parallel to the first surface. The second surface is movable between a first position and a second position. The first position is located at a first distance from the first surface. The second position is located at a second distance from the first surface. The second distance is greater than the first distance. The third surface is located between the first surface and the second surface. The third surface defines one or more gap regions between the first surface and the second surface when the second surface is in the first position, wherein the second surface in the one or more gap regions does not contact either the first surface or the third surface.

Another aspect of the invention provides a microelectromechanical device, which includes a first layer; a second layer and a plurality of members. The second layer is located substantially parallel to the first layer. The second layer is movable between a first position and a second position. The first position is a first distance from the first layer. The second position is a second distance from the first layer. The second distance is greater than the first distance. Each of the plurality of members includes a surface located between the first layer and second layer. The plurality of members define one or more gap regions between the first layer and the second layer when the second layer is in the first position, wherein the second layer in the one or more gap regions does not contact either the first layer or the plurality of members.

Still another aspect of the invention provides a microelectromechanical device, which includes a first surface, a second surface and at least one structure on at least one of the first surface and the second surface. The second surface is located substantially parallel to the first surface. The second surface is movable relative to the first surface between a driven position and an undriven position. The driven position is closer to the first surface than is the undriven position. The at least one structure is compressed by the first surface and the second surface when the second surface is in the driven position. The at least one structure provides a force to the second surface when the second surface is in the driven position. The force assists movement of the second surface from the driven position toward the undriven position.

Still another aspect of the invention provides a method of making an interferometric modulator. The method includes: providing a first layer, forming a second layer and forming a member comprising a surface. The first layer includes a first reflective planar portion. The second layer includes a second reflective planar portion. The second reflective planar portion is located substantially parallel to the first reflective planar portion. The second layer is movable between a first position and a second position. The first position is at a first distance from the first layer. The second position is at a second distance from the first layer. The second distance is greater than the first distance. The surface of the member is located between the first layer and the second layer. The member defines one or more gap regions between the first layer and the second layer when the second layer is in the first position, wherein the second layer in the one or more gap regions does not contact either the first layer or the member.

A further aspect of the invention provides a microelectromechanical device produced by a method. The method includes: providing a first layer, providing a second layer and providing a member comprising a surface. The first layer includes a first reflective planar portion. The second layer includes a second reflective planar portion. One of the first reflective planar portion and the second reflective planar portion may be partially reflective. The second reflective planar portion is located substantially parallel to the first reflective planar portion. The second layer is movable between a first position and a second position. The first position is at a first distance from the first layer. The second position is at a second distance from the first layer. The second distance is greater than the first distance. The surface of the member is located between the first layer and the second layer. The member defines one or more gap regions between the first layer and the second layer when the second layer is in the first position, wherein the second layer in the one or more gap regions does not contact either the first layer or the member.

A further aspect of the invention provides a method of operating a microelectromechanical device. Here, the device includes a first layer, a second layer and a member. The second layer of the device is located substantially parallel to the first layer. The member includes a surface intervening between the first layer and second layer. The surface of the member is located between only portions of the first layer and the second layer. The method of operating the device includes moving the second layer relative to the first layer from an undriven position to a driven position. The driven position is closer to the first layer than is the undriven position. The method further includes contacting the member with at least one of the first layer and the second layer so as to stop the movement of the second layer at the driven position, the member defining one or more gap regions between the first layer and the second layer when the second layer is in the driven position, wherein the second layer in the one or more gap regions does not contact either the first layer or the member.

A further aspect of the invention provides a microelectromechanical device. The device includes first means for partially reflecting and partially transmitting incident light and second means for substantially reflecting incident light. The device further includes means for moving the first means relative to the second means between a driven position and an undriven position. The device further includes means for providing a separation between the first means and the second means when the second means is in the driven position. The driven position is closer to the first means than is the undriven position. The first means may include, for example, a partial mirror surface. The second means may include, for example, a full mirror surface. The means for moving may include, for example, a deformable layer. The means for providing separation may include, for example, at least one of a bump, a landing pad or a spring clip.

A further aspect of the invention provides a microelectromechanical device. The device includes: first means for partially reflecting and partially transmitting incident light and second means for substantially reflecting incident light. The device further includes means for moving the first means relative to the second means between a driven position and an undriven position, and means for applying a force on the second means in a direction toward the undriven position when the second means is in the driven position. The first means may include, for example, a partial mirror surface. The second means may include, for example, a full mirror surface. The means for moving may include, for example, a deformable layer. The means for applying force may include, for example, a spring clip, or, as another example, a bump or a landing pad that includes an elastomeric material.

A still further aspect of the invention provides an interferometric modulator. The interferometric modulator includes a first layer, a second layer and at least one bump on the at least one of the first layer and the second layer. The first layer includes a first reflective planar portion. The second layer includes a second reflective planar portion that is located substantially parallel to the first reflective planar portion. The second layer is movable between a driven position and an undriven position. The driven position is closer to the first layer than the undriven position. The at least one bump is configured to prevent the first layer and the second layer from contacting each other.

A still further aspect of the invention provides an interferometric modulator, which includes a first layer, a second layer and at least one landing pad located between the first layer and the second layer. The first layer includes a first reflective planar portion. The second layer includes a second reflective planar portion that is located substantially parallel to the first reflective planar portion. The second layer is movable between a driven position and an undriven position. The driven position is closer to the first layer than the undriven position. The at least one landing pad includes a contact area where one of the first layer and the second layer contacts while not contacting the other when the second layer is in the driven position.

A still further aspect of the invention provides an interferometric modulator. The interferometric modulator includes a first layer, a second layer and at least one spring member placed between the at least one of the first layer and the second layer. The first layer includes a first reflective planar portion. The second layer includes a second reflective planar portion that is located substantially parallel to the first reflective planar portion. One of the first reflective planar portion and the second reflective planar portion may be partially reflective. The second layer is movable between a driven position and an undriven position. The driven position is closer to the first layer than the undriven position. The at least one spring member is compressible by at least one of the first layer and second layer as the second layer moves toward the driven position. The at least one spring member is configured to apply force to the second layer in a direction toward the undriven position when the second layer is in the driven position.

Another embodiment provides a display system comprising an interferometric modulator, a display, a processor and a memory device. The processor is in electrical communication with the display and configured to process image data. The memory device is in electrical communication with the processor.

Another embodiment provides a method of making a MEMS device, such as a MEMS device that includes an interferometric modulator. The method includes forming a first electrode, depositing a dielectric material over at least a portion of the first electrode, then removing a portion of the dielectric material from over the first electrode, thereby forming a variable thickness dielectric layer. The method further includes forming a second electrode over at least a portion of the variable thickness dielectric layer. In an embodiment, a sacrificial layer is deposited over at least a portion of the dielectric material that is over the first electrode. The sacrificial layer and at least a portion of the dielectric material may be removed during a later etching step. Another embodiment provides an interferometric modulator made by such a method.

Another embodiment provides a method of making an interferometric modulator. The method includes forming a first electrode and depositing a dielectric layer over at least a portion of the first electrode. The method further includes removing a portion of the dielectric layer to form a variable thickness dielectric layer, depositing a sacrificial layer over the variable thickness dielectric layer, planarizing the sacrificial layer, and forming a second electrode over the sacrificial layer. Another embodiment provides an interferometric modulator made by such a method.

Another embodiment provides a method of making an interferometric modulator. The method includes forming a first electrode and depositing a dielectric layer over at least a portion of the first electrode. The method further includes removing a portion of the dielectric layer to form a variable thickness dielectric layer, depositing a sacrificial layer over the variable thickness dielectric layer, depositing a planarization layer over the sacrificial layer, and forming a second electrode over the planarization layer. Another embodiment provides an interferometric modulator made by such a method.

BRIEF DESCRIPTION OF THE DRAWINGS

FIG. 25A is a side cross-sectional view of an alternative embodiment of an interferometric modulator shown in the undriven state.

FIG. 25B is a top plan view of the interferometric modulator of FIG. 25A, shown in the undriven state.

FIG. 25C is a side view of the interferometric modulator of FIG. 25A, shown in the driven state.

FIG. 25D is a top plain view of the interferometric modulator of FIG. 20C, shown in the driven state.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Driving an interferometric modulator may result in contact between a deformable layer and a stationary layer. Such contact may be undesirable and may result in damage to the device, potentially resulting in performance degradation. Various embodiments provides structures (such as landing pads, bumps and spring clips) and methods for reducing such damage.

Figure 1:
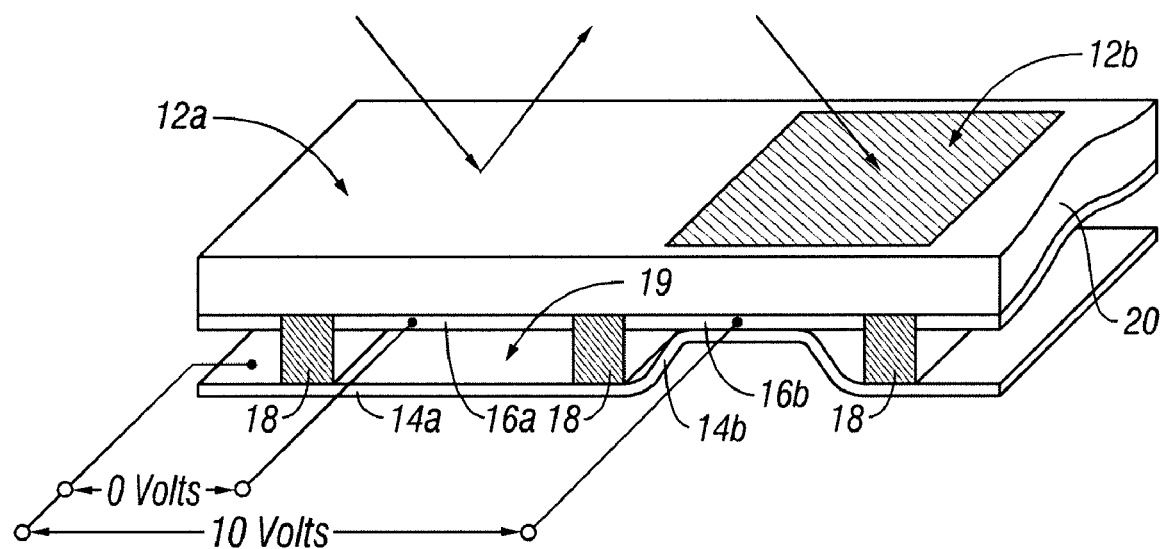
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
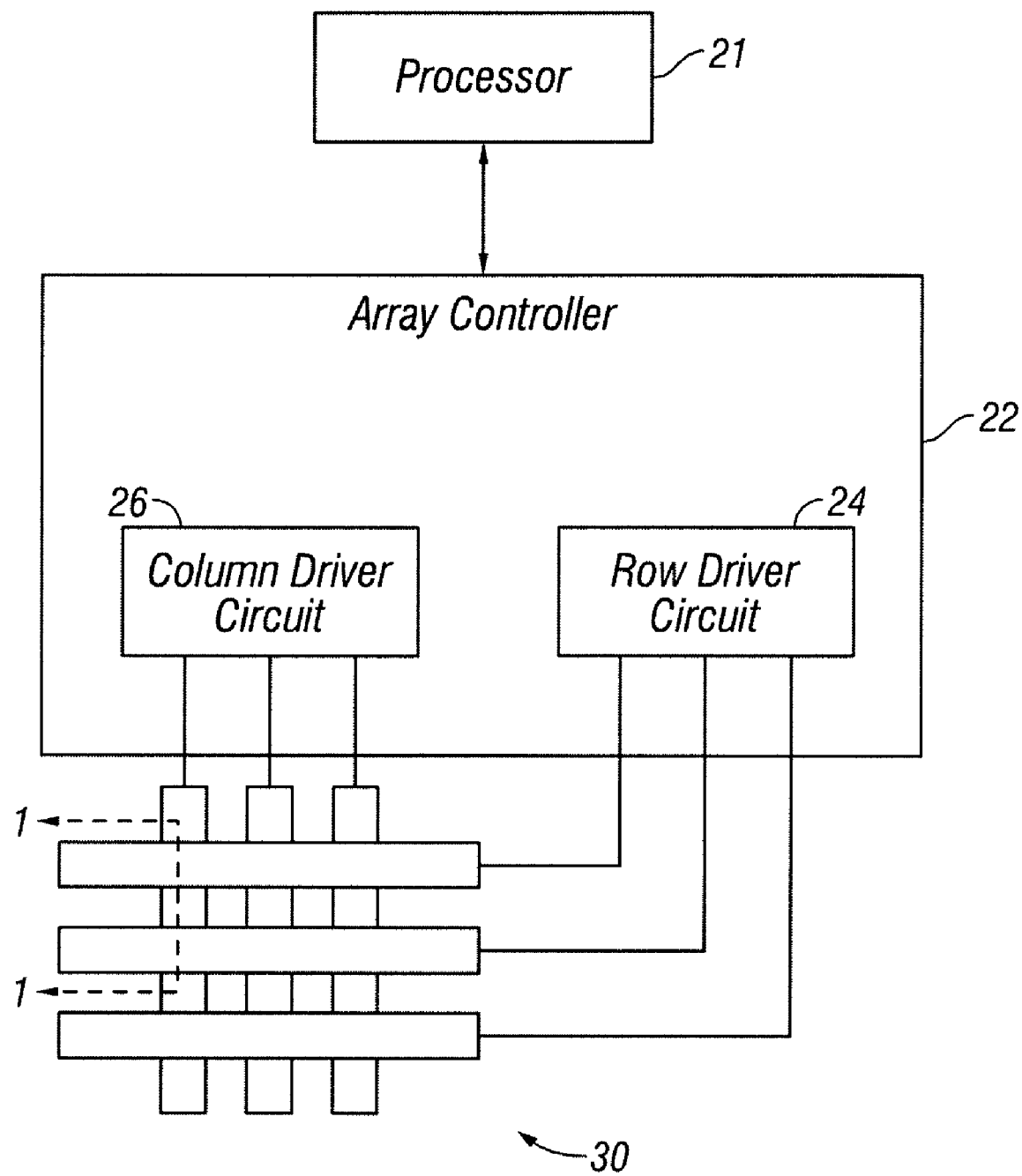
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
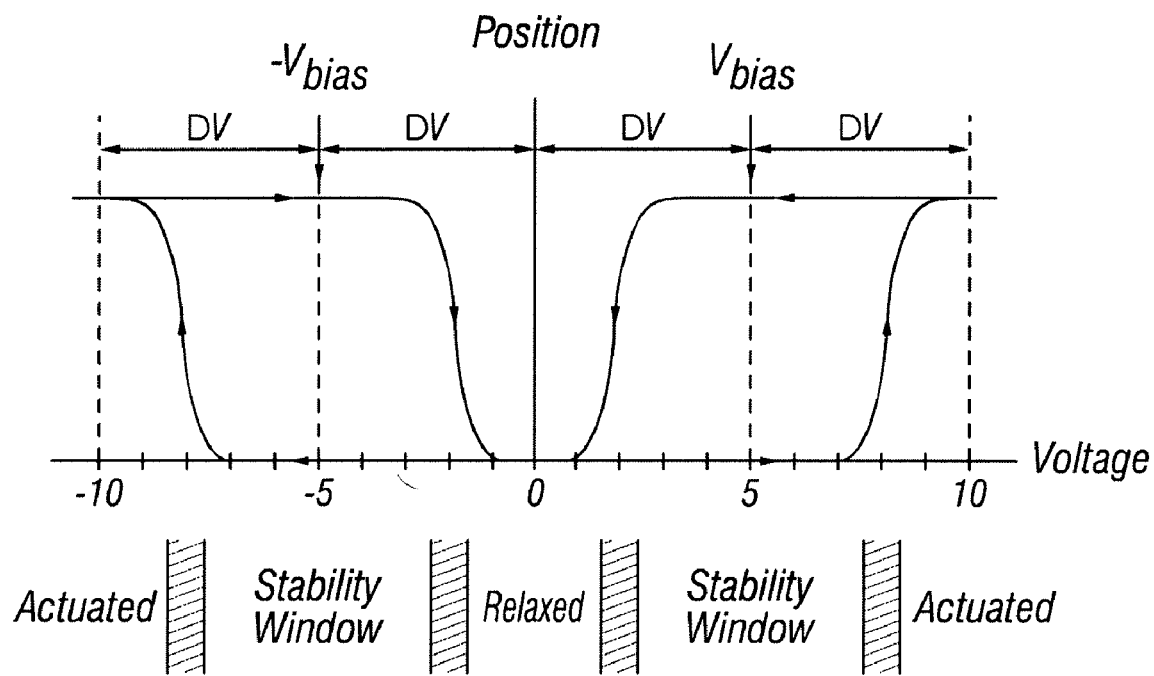
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
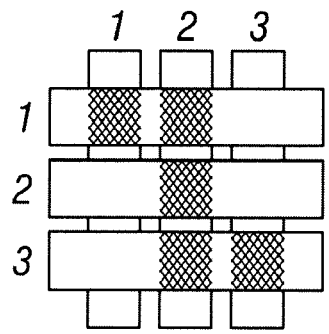
FIGS. 5A and 5B illustrate one exemplary timing diagram for row and column signals that may be used to write a frame of display data to the 3×3 interferometric modulator display of FIG. 2.
Figure 5B:
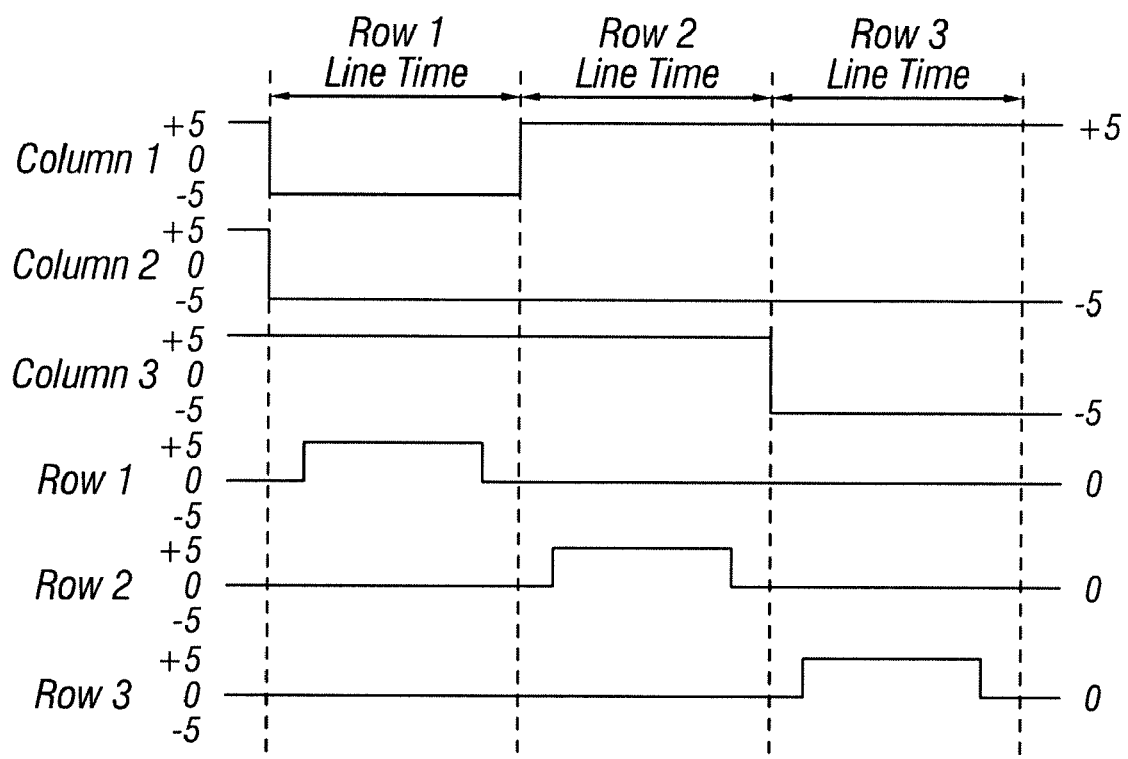

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
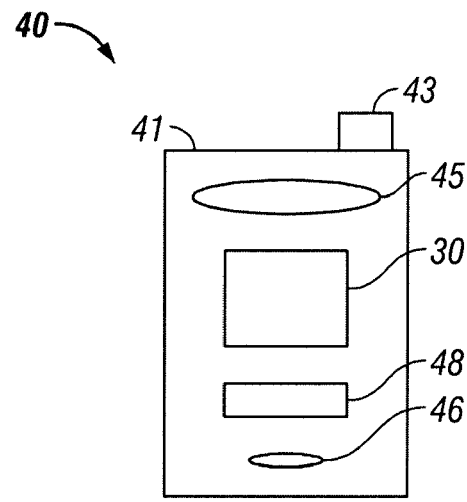
FIGS. 6A and 6B are system block diagrams illustrating an embodiment of a visual display device comprising a plurality of interferometric modulators.
Figure 6B:
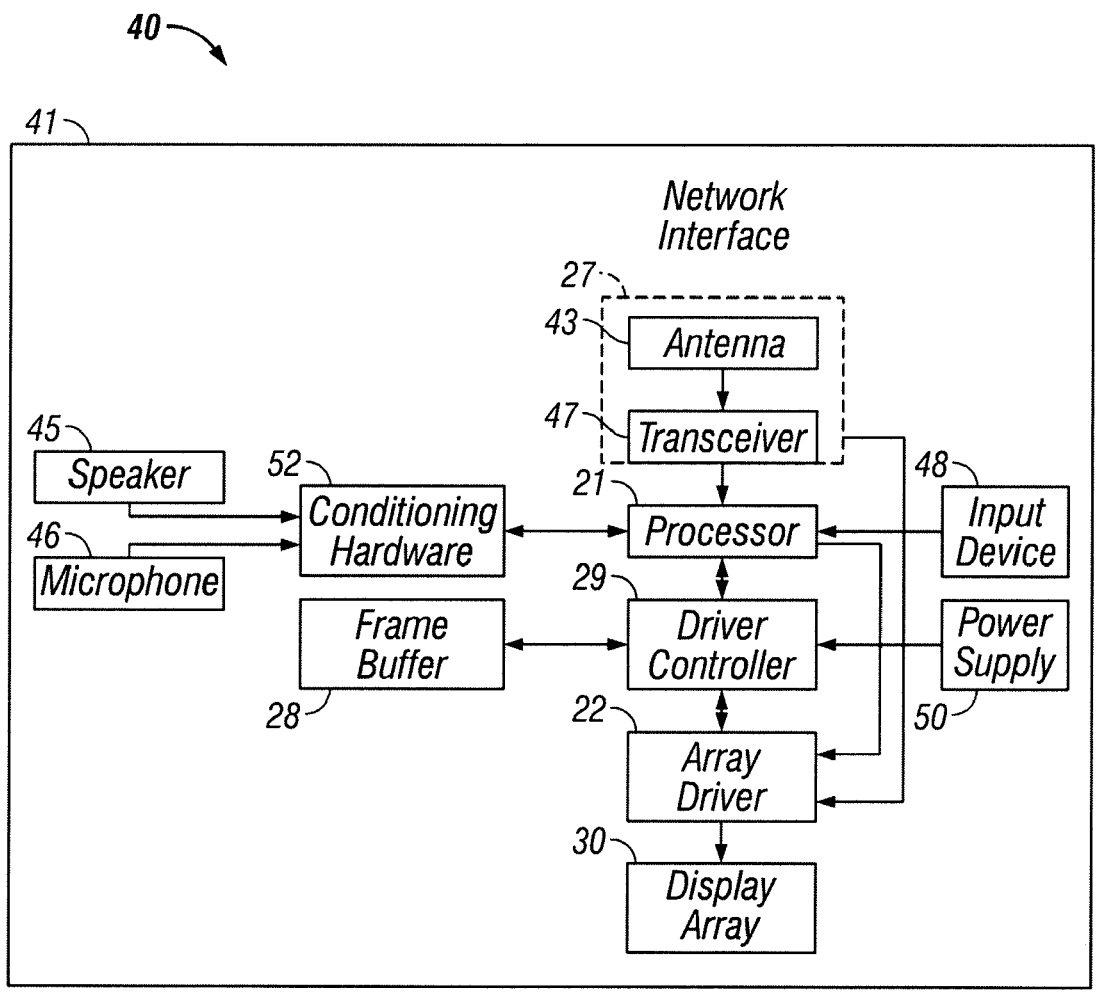

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
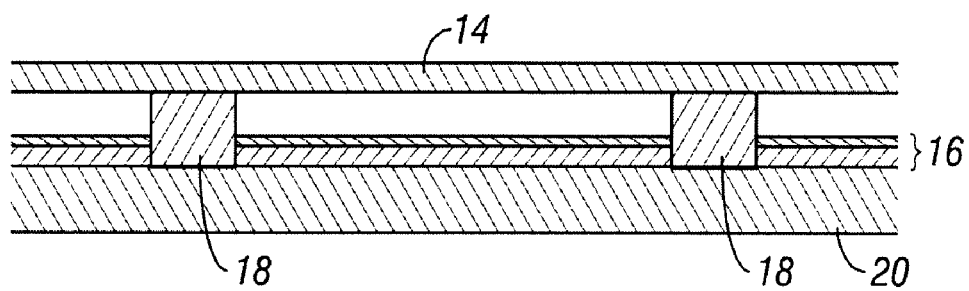
FIG. 7A is a cross section of the device of FIG. 1.
Figure 7B:
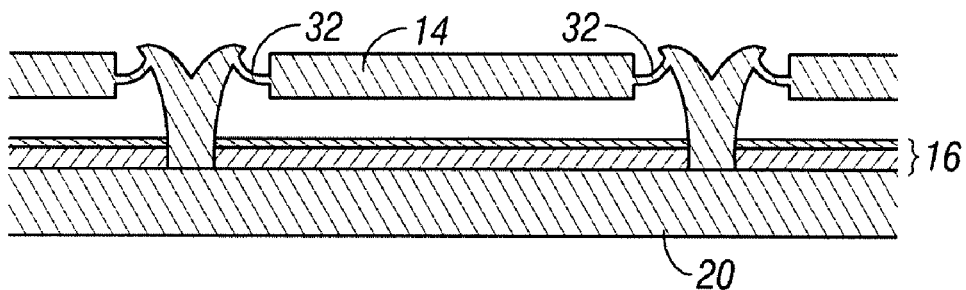
FIG. 7B is a cross section of an alternative embodiment of an interferometric modulator.
Figure 7C:
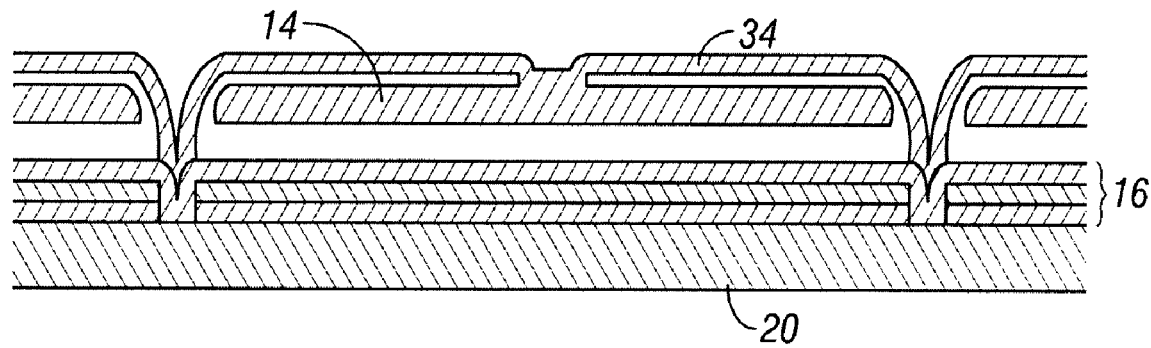
FIG. 7C is a cross section of another alternative embodiment of an interferometric modulator.
Figure 7D:
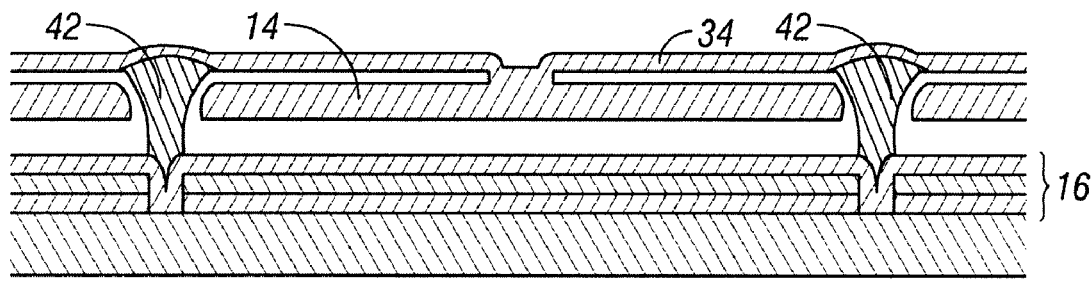
FIG. 7D is a cross section of yet another alternative embodiment of an interferometric modulator.
Figure 7E:
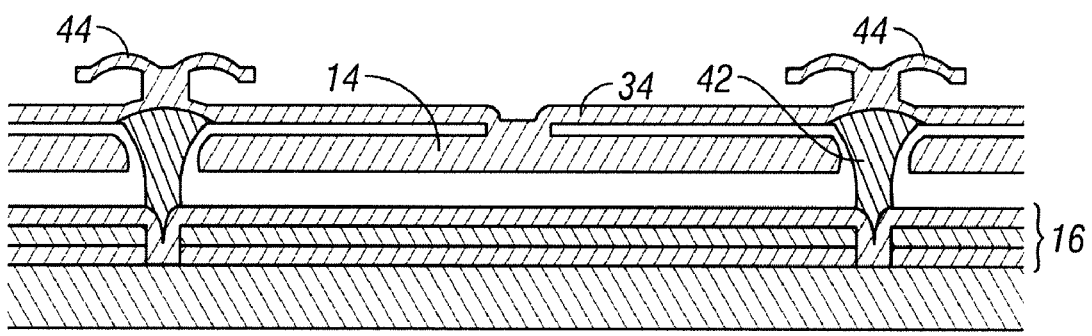
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
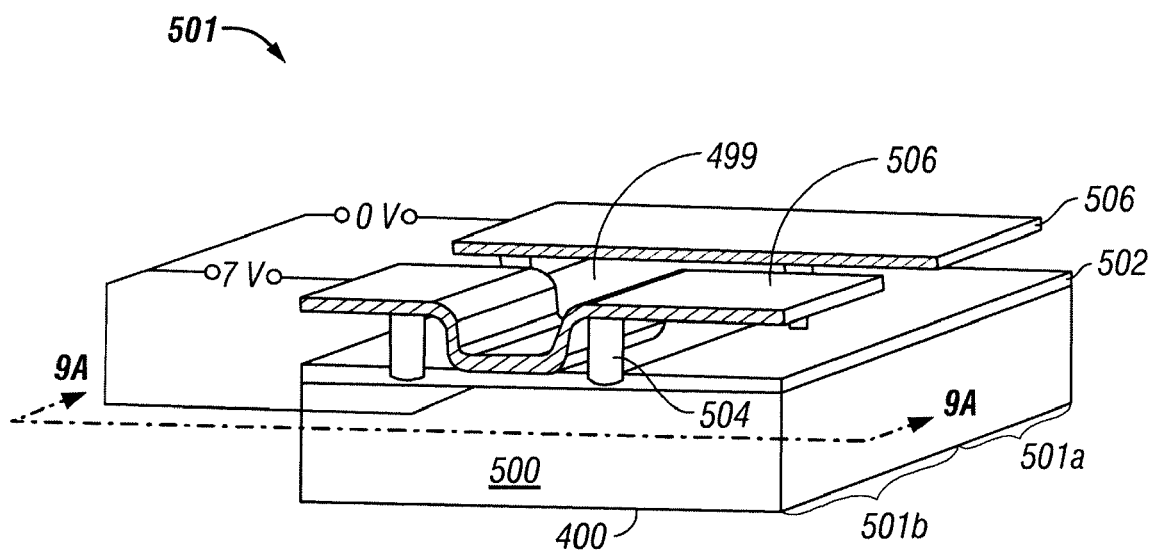
FIG. 8 is a perspective view of an interferometric modulator array which uses micro-electromechanical system technology.

FIG. 8 schematically illustrates a portion of an exemplary interferometric modulator array 501. The interferometric modulator array 501 is formed on a substrate 500, which is transparent for a predetermined light spectrum and has a bottom surface 400. Although not limited thereto, the substrate 500 is preferably made of glass. A single layer or stack of layers 502 is formed over the substrate 500. The single layer 502 or at least one sub-layer (not shown) of the stack of layers 502 is made of a conductive material. The layer 502 or a sub-layer serves as a partial mirror as it both reflects and transmits some of the light incident thereto. For the sake of convenience, the term "stationary layer 502" is used to refer to the single layer or stack of layers 502 unless the specific terms are used. Deformable layers 506 are located over the stationary layer 502. Support posts 504 are formed between the substrate 500 and the layers 506, separating the deformable layers 506 from the substrate 500 and the stationary layer 502. The deformable layers 506 lie in a generally parallel plane to that of the stationary layer 502. The surface of the deformable layers 506 facing the stationary layer 502 is highly reflective of the predetermined light spectrum and serves as a full mirror.

This interferometric modulator array 501 is operated by applying or not applying an electric potential difference between the conductive portion of the stationary layer 502 and the deformable layers 506. By applying a certain electric potential difference between them, for example 7 volts, the deformable layer 506 is driven to deform toward and contact the stationary layer 502 as in the case of the interferometric modulator 501b. In this driven state, the interferometric modulator 501b is, for example, in an induced absorption mode, in which most of the light incident to the substrate 500 is absorbed by the interferometric modulator 501b. If the interferometric modulator 501b is designed to operate in the visible light spectrum, the bottom surface 400 of the substrate 500 corresponding to the area of interferometric modulator 501b turns to black at the driven state.

The interferometric modulator 501a, on the other hand, is illustrated in the configuration produced when no voltage is applied between the deformable layer 506 and the stationary layer 502. This configuration is referred to as "the undriven state." In this state, the deformable layer 506 is maintained separate from the stationary layer 502, forming a space 499 referred to as an "interferometric cavity" between them. More accurately, the interferometric cavity 499 is defined as the distance between the reflective surface of the deformable layer 506 and the partial mirror surface of the stationary layer 502. Light that is incident to the interferometric modulator 501a through the substrate 500 is interferometrically modulated via the cavity 499. Depending on the depth of the cavity 499, which is the distance between the partial mirror surface of the stationary layer 502 and the full mirror surface of the deformable layer 506, the interferometric modulation selects a certain wavelength of the light, which is reflected from the bottom surface 400 of the substrate 500. If the selected wavelength of the light is visible, the bottom surface 400 of the substrate 500 displays a visible light corresponding to the wavelength. One of ordinary skill in the art will well appreciate the interferometric modulation produced in the interferometric modulator 501.

Figure 9A:
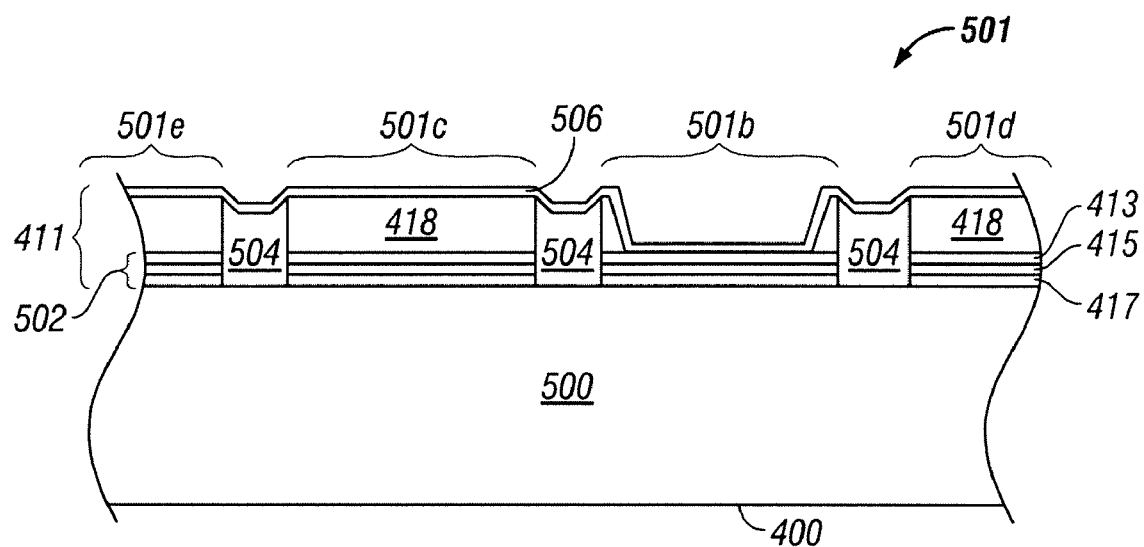
FIG. 9A is a schematic cross-sectional view of the interferometric modulator array of FIG. 7 taken along line 8A-8A of FIG. 7.

FIG. 9A is a cross-sectional view of the interferometric modulator 501 of FIG. 8 taken along lines 9A-9A. FIG. 9A illustrates additional interferometric modulators 501c-501e arranged in the lateral direction of the interferometric modulator 501b. In the illustrated embodiment, the stationary layer 502 is comprised of three sub-layers, for example, including a dielectric layer 413, a mirror layer 415 and a conductor layer 417. As illustrated, the deformable layer 506 is laterally spaced by the posts 504 and substantially parallel with the stationary layer 502, creating an interferometric cavity 418 between them. Although not illustrated, additional layers may be formed over the deformable layer 506. The overall microstructure formed over the substrate 500 constitutes an array of interferometric modulators or array 411. The interferometric modulator 501c is illustrated in an undriven state, which generally reflects a certain light through the substrate 500 depending upon the depth of the interferometric cavity 418. Again, this depth determines the wavelength of light reflected on the surface 400. The interferometric modulator 501b is illustrated in a driven state, which generally reflects no light on the surface 400. The operation of the interferometric modulators 501b and 501c will be well appreciated by one of ordinary skill in the art.

Figure 9B:
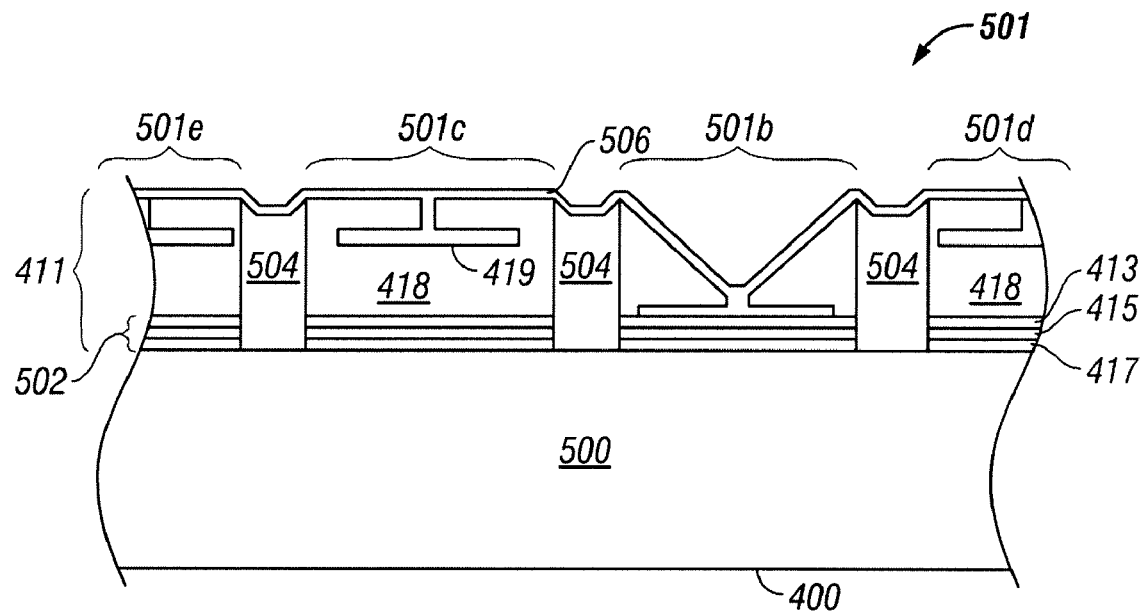
FIG. 9B is a schematic cross-sectional view of another embodiment of the interferometric modulator array utilizing micro-electromechanical system technology.

FIG. 9B illustrates the micro-construction of another embodiment of the interferometric modulator 501. In this embodiment, the deformable layer 506 is connected to a mirror 419, which is located between the deformable layer 506 and the stationary layer 502. All of the other features are the same as in the embodiment of FIG. 9A. In one embodiment, the mirror 419 is substantially rigid and has a highly reflective surface facing the stationary layer 502. The deformable layer 506 functions to control the location of the mirror 419 with respect to the stationary layer 502, and the rigid mirror 419 does not experience any significant bending or deformation in this process. In this embodiment, the interferometric cavity 418 is defined by the space between the mirror 419 and the stationary layer 502, and more accurately the mirror layer 415. The interferometric modulator 501c is illustrated in an undriven state, while the interferometric modulator 501b is illustrated in a driven state.

In the embodiments illustrated in FIGS. 9A and 9B, the stationary layer 502 may be formed by a single layer functioning as both a conductor and a mirror. Alternatively, the stationary layer 502 may be formed of two layers, for example the pair of a mirror layer and a conductive layer, the pair of a dielectric layer and a bi-functional layer of electrode and mirror. Further, in other embodiments, one or more additional layers may be formed over the stationary layer 502 or in between the layers 413, 415 and 417. Also, although not illustrated, the deformable layer 506 or the mirror 419 of the embodiments of FIGS. 9A and 9B may have a laminated construction. For example, a dielectric layer may be formed on a surface of the deformable layer 506 (FIG. 9A) or the mirror 419 (FIG. 9B), particularly the surface facing the stationary layer 502. The dielectric layer on the deformable layer 506 (FIG. 9A) or the mirror 419 (FIG. 9B) may be useful when the stationary layer 502 has the construction that does not include the dielectric layer 413. One of ordinary skill in the art will appreciate the formation of various films or layers making the stationary layer 502 and/or the additional layers that can be formed on the deformable layer 506 or mirror 419.

In a typical construction, as illustrated in FIGS. 8, 9A and 9B, the deformable layer 506 or the mirror 419 may physically contact the stationary layer 502 during its operation, particularly when the interferometric modulator 501 is in its driven state. Physical contact or interaction between the two layers may cause some adverse results, particularly if it is between the surfaces defining the interferometric cavity, which are mirror surfaces of the stationary layer 502 and the deformable layer 506 (or mirror 419). The dielectric layer 413 over the mirror layer 415 is provided to minimize or reduce the mechanical and/or electrical interactions between the surfaces forming the interferometric cavity. For the same reason, a dielectric layer (not shown) can be formed on the surface of the deformable layer 506 or the mirror 419. However, repeated changes between the driven and undriven states can eventually result in degradation of such dielectric layers mechanically and/or electrically.

Also, the dielectric layers may contain some charges in them due to, not limited to, imperfection of the manufacturing processes. The charges in the dielectric layers may create attractive forces between the deformable layer 506 (or mirror 419) and the stationary layer 502. Some additional force may be needed to separate the deformable layer 506 (or the mirror 419) from the stationary layer 502 when a unit of the interferometric modulator 501 is operating from its driven state to undriven state. Also, when the dielectric layer 413 contacts the deformable layer 506 (or the mirror 419), there may be some other form of attractive force between the materials of the two contacting layers. Furthermore, even in an embodiment where the stationary layer 502 does not contact the deformable layer 506 (or the mirror 419) in the driven state, the gap between them is generally very small, for example, in the order of 200 Å (20 nm). In certain conditions, moisture from the surrounding environment may condense in the small gap and form a liquid layer. To separate the layers in that condition, additional force overcoming the surface tension of the liquid layer is needed.

The degradation of the dielectric layer(s) and the need for additional forces may be overcome by various techniques and features of embodiments described herein, which include use of components such as landing pads, bumps and springs. Although introduced in light of the degradation of the dielectric layer and the associated need for the additional force, the below-described technical features may be used in any constructions of the interferometric modulator utilizing the MEMS technology without such degradation or need of additional force. For the sake of simplicity, the below-described embodiments of the interferometric modulators have the general architecture illustrated in FIGS. 8 and 9A. However, all of the features can be applied to any other architecture of the interferometric modulators, including the embodiment illustrated in FIG. 9B.

An embodiment provides an interferometric modulator, comprising: a first layer comprising a first reflective planar portion; a second layer comprising a second reflective planar portion located substantially parallel to the first reflective planar portion, the second layer movable between a first position and a second position, the first position being a first distance from the first layer, the second position being a second distance from the first layer, the second distance being greater than the first distance; and a member having a surface located between the first layer and the second layer, the member defining one or more gap regions between the first layer and the second layer when the second layer is in the first position, wherein the second layer in the one or more gap regions does not contact either the first layer or the member. Various aspects of this embodiment are described in greater detail below.

Landing Pads

Figure 10A:
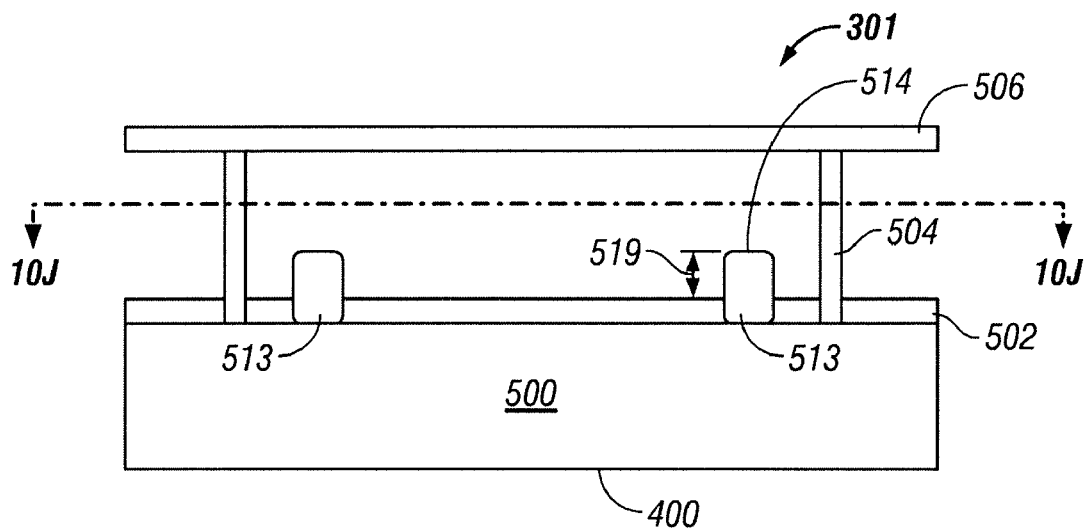
FIG. 10A is a side cross-sectional view of an embodiment of the interferometric modulator including landing pads with the modulator shown in the undriven state.
Figure 10B:
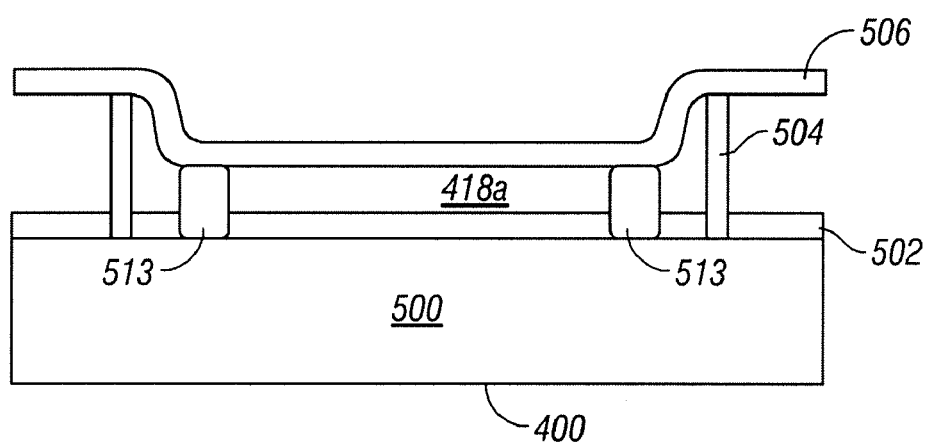
FIG. 10B is a side cross-sectional view of the embodiment of FIG. 9A in the driven state.

FIGS. 10A and 10B illustrate an embodiment of the interferometric modulator 301 which includes landing pads 513. In the illustrated embodiment, the landing pads 513 extend from the substrate 500 through the stationary layer 502 beyond the top surface of the stationary layer 502. Accordingly, when the interferometric modulator 301 is driven from its undriven state (FIG. 10A) to the driven state (FIG. 10B), travel of the deformable layer 506 is interrupted by the landing pads 513, which operate to prevent further travel of the deformable layer 506 toward the stationary layer 502, and thus to prevent the physical contact between those layers 502 and 506, and to maintain a desired separation distance between the layers 506 and 502. As discussed above with reference to FIGS. 9A and 9B, the stationary layer 502 can be formed of a single layer or multiple layers. Also, the stationary layer 502 may or may not include a dielectric layer 413. It will be recognized that the landing pads 513 are examples of members having a surface 514 located between the deformable layer 506 and the stationary layer 502. The landing pads 513 define a gap region 418a between the deformable layer 506 and the stationary layer 502 when the interferometric modulator 301 is in the driven state (FIG. 10B). The deformable layer 506 in the gap region 418a does not contact either the stationary layer 502 or the landing pads 513.

Figure 10C:
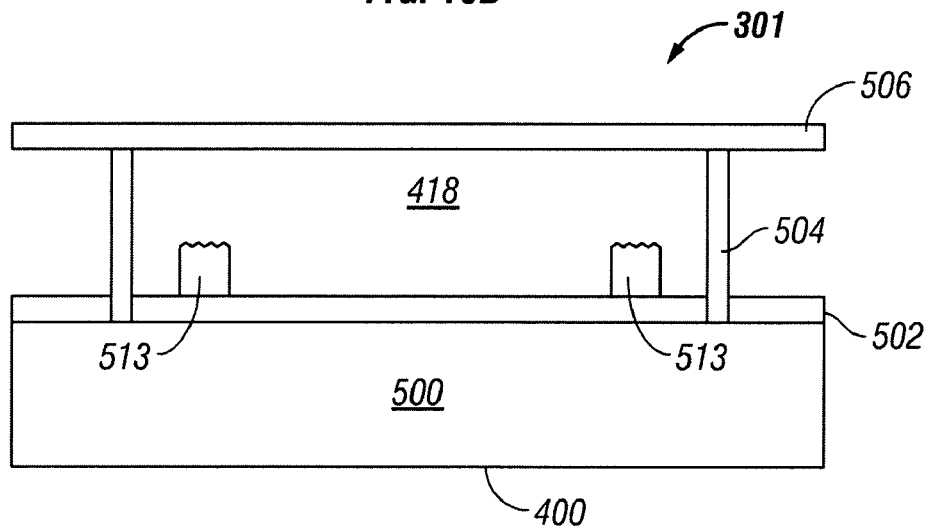
FIGS. 10C-10I are side cross-sectional views of embodiments of the interferometric modulator, illustrating various configurations of landing pads.
Figure 10D:
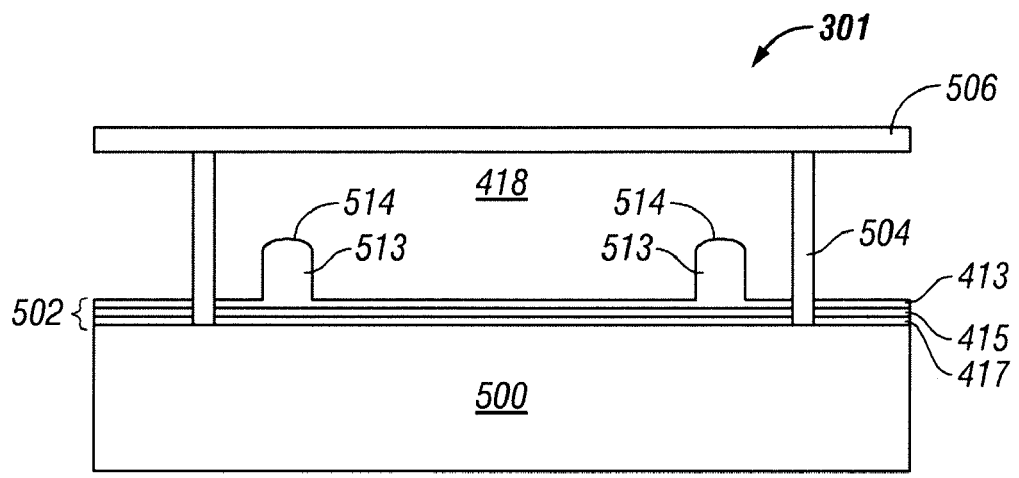
Figure 10E:
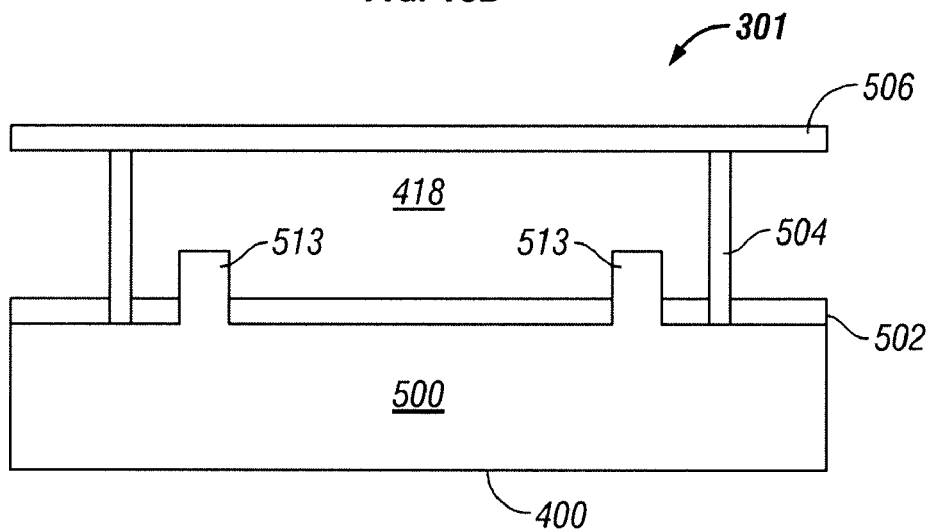
Figure 10F:
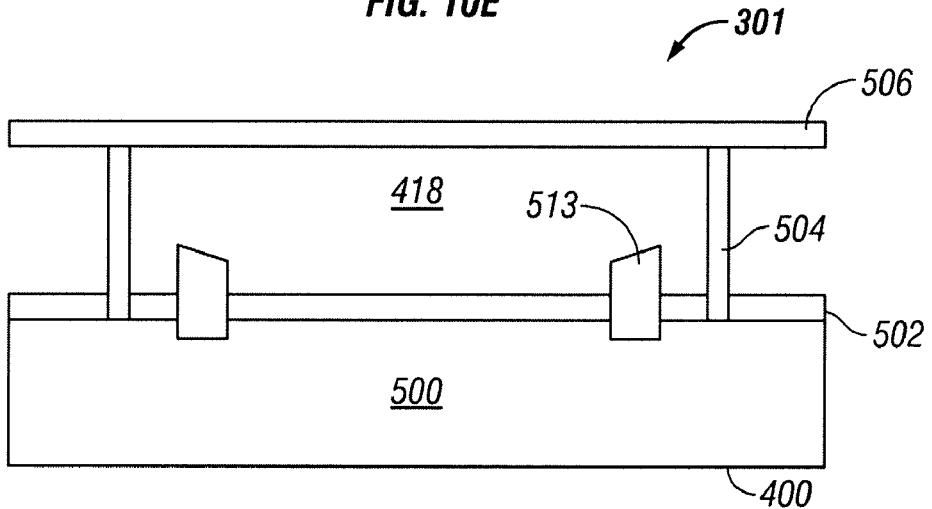

In another embodiment as illustrated in FIG. 10C, the landing pads 513 may be formed on the top surface of the stationary layer 502. In another embodiment as illustrated in FIG. 10D, the landing pads 513 may extend from a sub-layer 415 of the stationary layer 502 through one or more other sub-layers 413. In still another embodiment as illustrated in FIG. 10E, the landing pads 513 may be integrally formed with the substrate 500 and extend through the stationary layer 502. In a further embodiment, as illustrated in FIG. 10F, the landing pad 513 may extend from below the interface between the substrate 500 and the stationary layer 502 and through both the substrate 500 and the stationary layer 502.

Figure 10G:
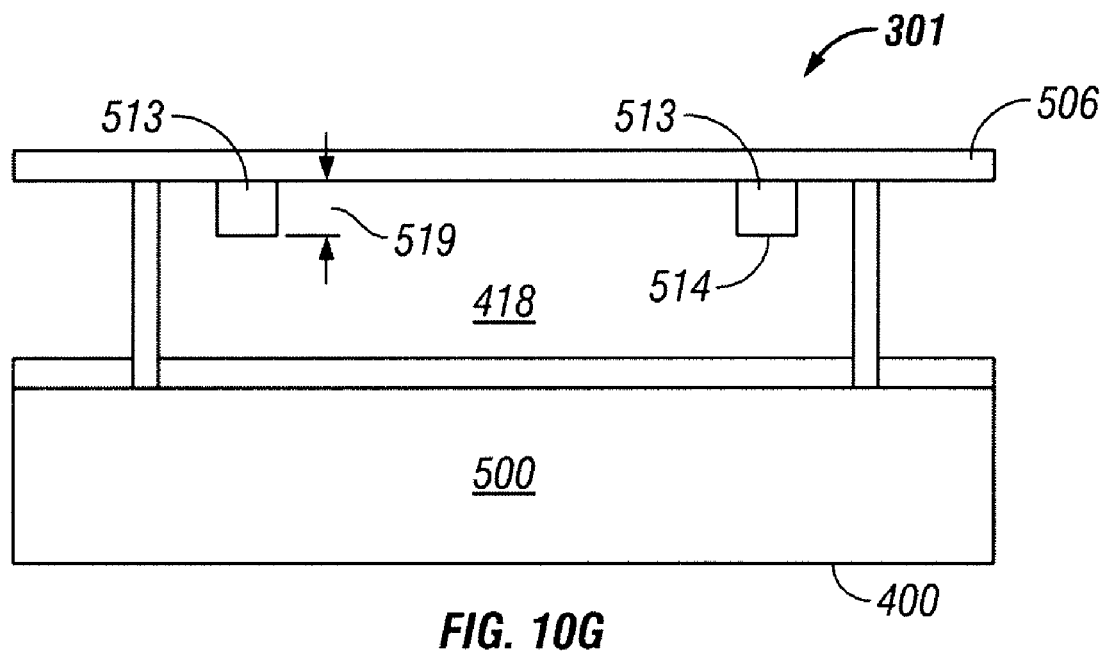
Figure 10H:
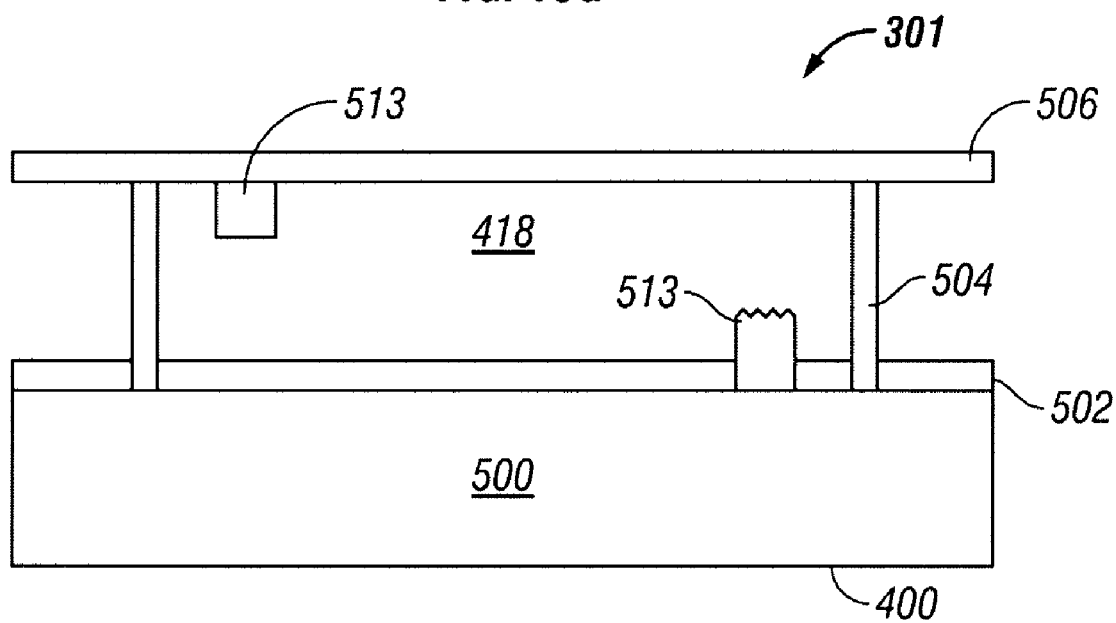
Figure 10I:
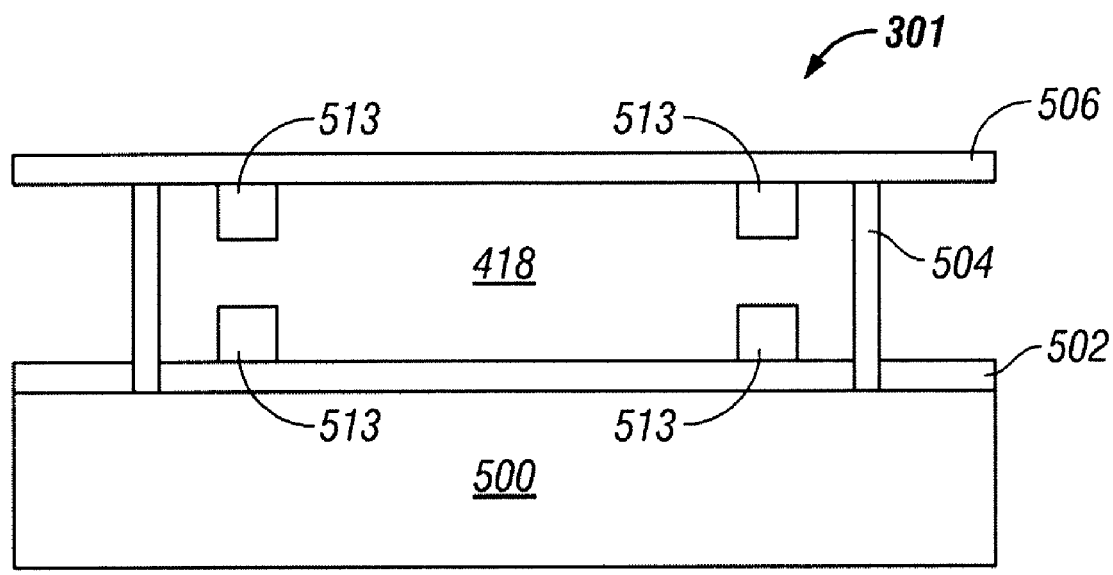

In another embodiment as illustrated in FIG. 10G, the landing pads 513 may be formed on the deformable layer 506 or mirror 419 (not shown). In other embodiments as illustrated in FIGS. 10H and 10I, the landing pads 513 may be formed on both the deformable layer 506 and the stationary layer 502. In the foregoing embodiments where one or more landing pads 513 are formed on the deformable layer 506, although not illustrated, the landing pads 513 may extend from various sub-layers, if any, of the deformable layer 506, as the landing pads 513 may extend from various sub-layers of the stationary layer 502 or substrate 500 illustrated in FIGS. 10A-10F.

Figure 10J:
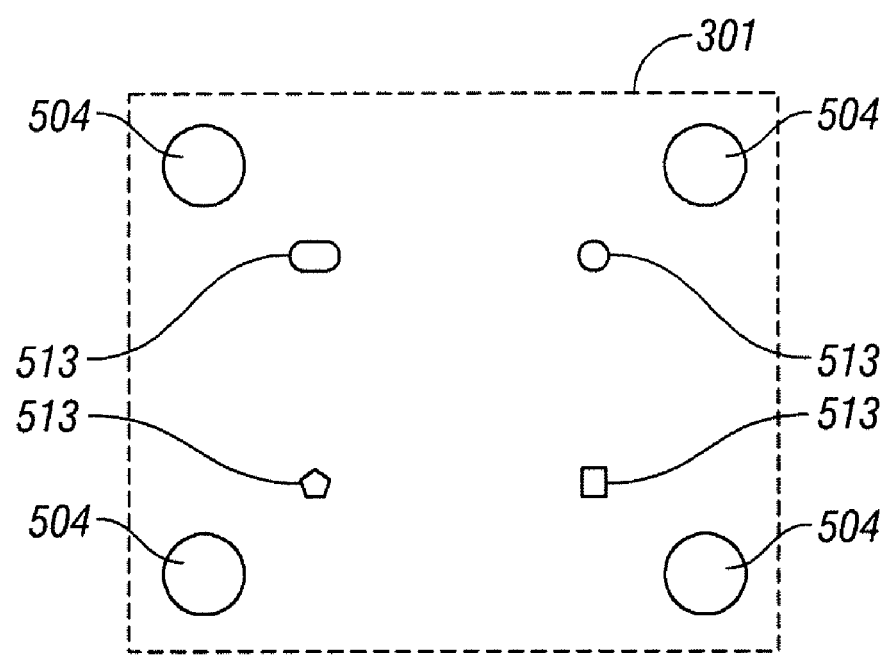
FIG. 10J is a top cross-sectional view of an embodiment of the interferometric modulator taken along line 9J-9J of FIG. 9A and illustrating various shapes of landing pads.

The landing pads 513 can be positioned in various locations on the stationary layer 502 or the deformable layer 506, or both within the interferometric cavity 418. FIG. 10J is a top cross-sectional view of the embodiment of FIG. 10A taken along line 10J-10J (FIG. 10A). In the illustrated embodiment of FIG. 10J, for example, the landing pads 513 are located generally on peripheral portions of the stationary layer 502 and/or deformable layer 506 within the interferometric cavity 418. Optionally, the landing pads 513 are positioned on the portions of the stationary layer 502 and/or deformable layer 506 where the existence of the landing pads 513 would not affect the optical characteristics of the interferometric modulator 301. In another embodiment (not illustrated), the landing pads 513 can be positioned on a central portion of the stationary layer 502 and/or deformable layer 506 within the interferometric cavity 418. In still another embodiment (not illustrated), the landing pads 513 can be positioned on both the central and peripheral portions of the stationary layer 502 and/or deformable layer 506 within the interferometric cavity 418. In a further embodiment (not illustrated), the landing pads 513 can be located where the deformable layer 506 first contacts the stationary layer 502.

Referring again to FIGS. 10A and 10G, it is seen that the landing pads 513 extend beyond the surface of the stationary layer 502 (FIG. 10A) or the deformable layer 506 (FIG. 10G) by a height indicated at 519. In one embodiment, the landing pad height 519 is selected so as to prevent physical contact between the deformable layer 506 and the stationary layer 502. In another embodiment, the height 519 is selected to not only prevent such contact, but to define the depth of the interferometric cavity 418 in the driven state of the interferometric modulator 301, and so as to enable production of the desired optical characteristics of the interferometric modulator 301. In one embodiment, the landing pads 513 are configured to precisely define the distance between the two layers 506 and 502. Thus, the landing pads 513 can be used to control the minimal size of the interferometric cavity 418 with a high degree of accuracy and precision.

In one embodiment of interferometric modulator 301 for use as a display element, the interferometric cavity depth at the driven state is short enough to absorb most, if not all, of the visible light. In another embodiment of interferometric modulator 301 for use as a display element, the interferometric cavity depth at the driven state reflects a selected visible wavelength of incident light. Since the interferometric cavity depth at the driven state is determined by the thickness of various layers and/or structures positioned between the reflective surfaces of the layers 502 and 506, the height 519 of the landing pad 513 is designed in view of the color to be displayed on the substrate 500. In such display embodiments, the height 519 is, for example, from about 50 Å to about 1500 Å, and preferably from about 100 Å to about 300 Å.

In one embodiment, the landing surface 514 of the landing pads 513 is substantially planar, as illustrated in FIG. 10A. Also as in the embodiment illustrated in FIG. 10A, the landing surface 514 may be substantially parallel to the surface of the deformable layer 506 or the stationary layer 502 that lands on the landing surface 514. In this embodiment, the size of the landing surface 514 is from about 0.1 micron to about 25 microns, and preferably from about 3 microns to about 10 microns. In another embodiment as illustrated in FIG. 10C, the landing surface 514 of the landing pads 513 may be rough, bumpy or embossed. In another embodiment as illustrated in FIG. 10F, the landing surface 514 of the landing pads 513 may be tilted from the plane parallel to the counterpart surface landing on the landing surface 514. In still another embodiment as illustrated in FIG. 10D, the landing surface 514 may be substantially round.

The landing pads 513 can be made from various materials, including, but not limited to, a metal, an alloy, a dielectric material, and an elastomeric material. For example, such materials may include metals including aluminum, semiconductors, oxides of metals or semiconductors, nitrides of metals or semiconductors, and oxynitrides of metals or semiconductors. Preferably, the materials forming landing pads 513 are those that substantially do not or only insignificantly affect the electrical or optical characteristics of the interferometric modulator 301.

In one embodiment, the landing pads 513 are optically transparent for the light spectrum which the interferometric modulator 301 can select. Optionally, in the case where the light spectrum includes visible light, the transparent material that can be used for the landing pads 513 includes, for example, oxides of metals or semiconductors, nitrides of metals or semiconductors, and oxynitrides of metals or semiconductors. In another embodiment, the landing pads 513 may be made of a material that absorbs the light spectrum which the interferometric modulator 301 can select. In another embodiment, the landing pads 513 may be covered with the light absorbing material. Optionally, in the case where the light spectrum includes visible light, the light absorbing material that can be used for the landing pads 513 includes, for example, polymeric materials or metals, such as chrome, nickel, titanium, molybdenum, etc. In still another embodiment, the landing pads 513 may be made of a material that reflects the light spectrum which the interferometric modulator 301 can select. In still another embodiment, the landing pads 513 may be covered with the light reflecting material. Optionally, in the case where the light spectrum includes visible light, the light reflecting material that can be used for the landing pads 513 includes, for example, polymeric materials or metals, such as silver, aluminum, gold, platinum, etc.

In a unit of the interferometric modulator 301, multiple landing pads 513 can be used. Thus, 2, 3, 4, 5, 6 or more landing pads 513 can be fabricated to provide the landing surfaces of the layers of the interferometric modulator 301. Preferably, the multiple landing pads 513 have substantially the same heights 519. Optionally, the multiple landing pads 513 are arranged as remote as possible from one another on the stationary layer 502 or the deformable layer 506. In one embodiment, a single landing pad 513 per unit of the interferometric modulator 301 can be used.

The landing pads 513 may be positioned in any cross-sectional shape lying in a plane parallel to the stationary layer 502. In the embodiment illustrated FIG. 10J, the cross-sectional shape of the landing pads 513 is substantially circular, oval, rectangular and pentagonal, although not limited thereto.

The landing pads 513 can be fabricated in various configurations and made of various compounds as discussed above, utilizing the presently existing techniques of depositing and selectively etching a material. In one embodiment, the landing pads 513 can also be created from deformations of the layers of the interferometric modulator 301. In another embodiment, the landing pads 513 can be created using conventional semiconductor manufacturing techniques.

MEMS devices often comprise an array of individual elements activated by application of a voltage potential. The elements may comprise many different types of structures, including mirrors, switches, gears, motors, etc. The application of the voltage potential may be done by applying the potential directly to the structure, or by manipulation of electrical or magnetic fields around the structure. For example, an element may be activated by electrostatic attraction between the element and another structure to which the voltage is applied. For purposes of this discussion, the structure to which the voltage is applied will be referred to as an electrode.

In this type of device, there is generally a gap between the element and the electrode. This gap may give rise to capacitive charge between the element and the electrode. For most MEMS devices with this type of structure, the performance of the device will be improved by lowering the capacitance in the gap. This reduction of capacitance produces more predictable performance, and there is a lowered risk of capacitive discharge, which can damage the element or the neighboring elements.

In a bi-chrome display, such as a display that switches between black and white, one interferometric modulator element might correspond to one pixel. In a color display, three or more interferometric modulator elements may make up each pixel, e.g., one each for red, green and blue. The individual interferometric modulator elements are controlled separately to produce the desired pixel reflectivity. Typically, a voltage is applied to the movable wall, or element, of the cavity, causing it to be electrostatically attracted to the other electrode, resulting in a change in the color of the pixel seen by the viewer.

The interferometric modulator is merely one type of an active MEMS device that has an element separated from an electrode, where the electrode is used to activate the device. Another example may be a MEMS switch. These devices may suffer from high capacitance that may affect their operation. If a device has high capacitance in the mechanically relaxed state, it may take longer for the attractive charge to activate the device, slowing the device response time.

The capacitance of the device can be approximated by the capacitance of an idealized parallel-plate capacitor, given by $C = \in A/d$, where $\in$ is the electrical permittivity of the material between the movable wall and the electrode, A is the surface area of the electrode, and d is the gap distance between the movable wall and the electrode. The electrical permittivity of a material is equal to the dielectric constant K of the material multiplied by the electrical permittivity $\in_0$ of vacuum. In various embodiments, the capacitance between the movable wall and the electrode is reduced by increasing the size of the gap between the electrode and the movable wall and/or by lowering the dielectric constant of the material within the gap (that is, by decreasing $\in$ in the above equation). For example, the gap can comprise a material with a low dielectric constant, such as a gas or a mixture of gases (e.g., air). This use of a material within the gap with a reduced dielectric constant has the effect of lowering the capacitive charging of the dielectric surface, thereby lowering the capacitance.

Figure 11:
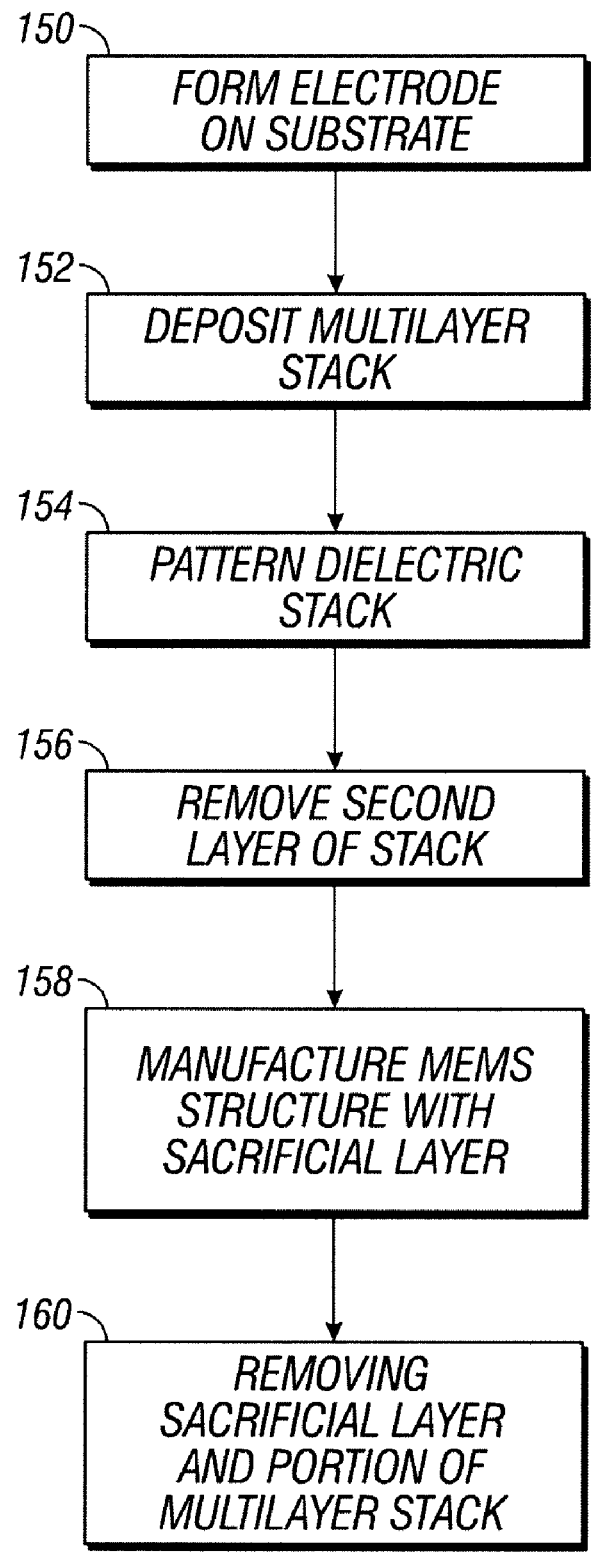
FIG. 11 is a flowchart illustrating a method of manufacturing a MEMS device having a variable thickness dielectric layer.

An embodiment of a processing flow for a MEMS device is shown in FIG. 11. In that embodiment, an electrode is formed on a substrate at step 150. A multilayer dielectric stack is deposited at step 152, and patterned at step 154. Portions of the multilayer dielectric stack, e.g., a thin oxide stop layer, are removed at step 156. The MEMS device then undergoes its appropriate processing at step 158, where the processing includes the use of a sacrificial layer to form the gap. The sacrificial layer, and portions of the multilayer dielectric stack not under the oxide stops, are removed at step 160. In another embodiment, a graded dielectric material is deposited at step 152 instead of the multilayer dielectric stack. The remainder of the process illustrated in FIG. 11 continues in a similar manner, including removing upper portions of the graded dielectric material at step 156, and removing lower portions of the graded dielectric material at step 160, along with the sacrificial layer.

Figure 12:
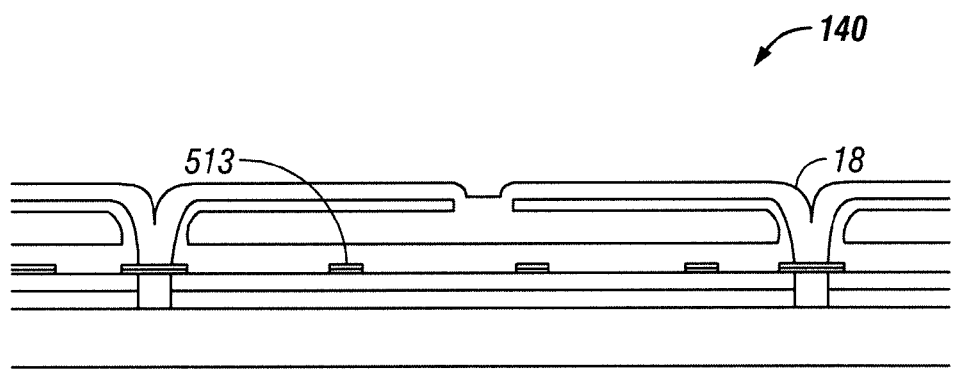
FIG. 12 is a cross-sectional view schematically illustrating an alternative embodiment of a MEMS device having a variable thickness dielectric layer.

An embodiment of an interferometric modulator having a multilayer dielectric stack is shown in FIG. 12. In this embodiment the portions of the dielectric stack 513 not removed appear across the device 140, rather than just under the support posts 18. The process of forming the oxide stops can be modified as desired to leave portions of the dielectric stack wherever desired.

Figure 13:
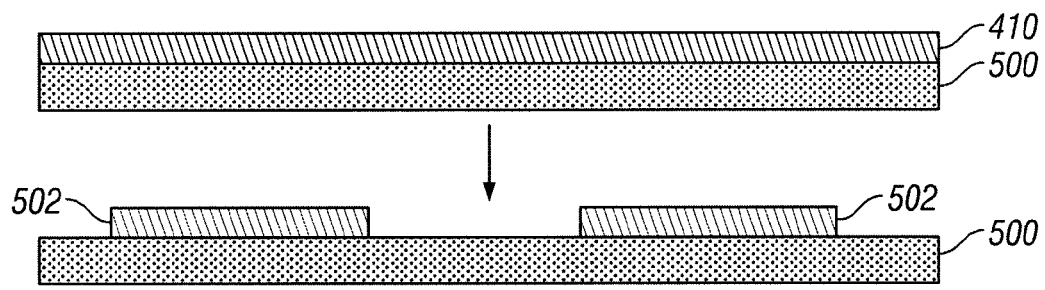
FIG. 13 is a cross-sectional view schematically illustrating the formation of a lower electrode 502 in accordance with an embodiment.

FIGS. 13-19 illustrate an embodiment of a process for the fabrication of an interferometric modulator that includes landing pads 513, using conventional semiconductor manufacturing techniques such as photolithography, deposition, masking, etching (e.g., dry methods such as plasma etch and wet methods), etc. Deposition includes "dry" methods such as chemical vapor deposition (CVD, including plasma-enhanced CVD and thermal CVD) and sputter coating, and wet methods such as spin coating. FIG. 13 illustrates the formation of a stationary layer 502, which can be a single layer structure or multiple sub-layer structure as described above. In a single layer structure where the layer 502 functions as both electrode and mirror, the layer 502 is formed by deposition of an electrode material 410 on the substrate 500 and subsequent patterning and etching. The electrode material 410 is conductive and may be a metal or a semiconductor (such as silicon) doped to have the desired conductivity. In one embodiment (not shown in FIG. 13), the electrode layer 410 (and the corresponding first electrode 502) is a multilayer structure comprising a transparent conductor (such as indium tin oxide) and a primary mirror (such as chromium).

Figure 14:
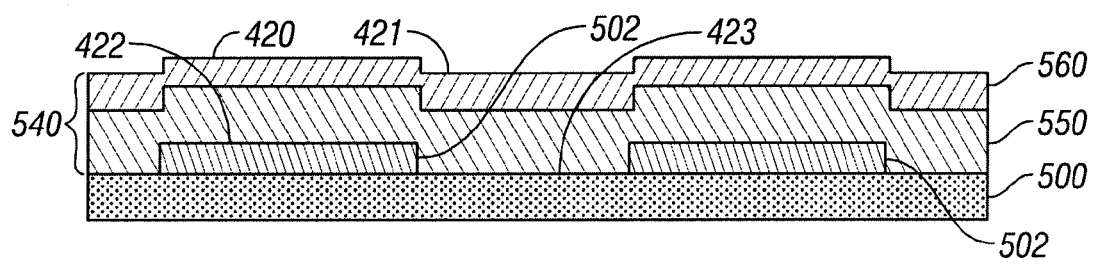
FIG. 14 is a cross-sectional view schematically illustrating the formation of a dielectric layer 540 (including a lower portion 550 and an upper portion 560) on the stationary layer 502 and over the substrate 500 of FIG. 13.

FIG. 14 illustrates the formation of a dielectric layer 540 on the substrate 500 and the stationary layer 502 by deposition, preferably by CVD. The lower or "bulk" portion 550 of the dielectric layer 540 need not be a dielectric material and is preferably a material that may be removed in a later etching step, and thus may be molybdenum, a silicon-containing materials (e.g., silicon, silicon nitride, silicon oxide, etc.), tungsten, or titanium, preferably silicon oxide. The upper or "stop" portion 560 of the dielectric layer 540 is preferably a material that is more resistant to a later etching step than the bulk portion 550, and may be a metal (e.g., titanium, aluminum, silver, chromium) or a dielectric material, preferably a metal oxide, e.g., an aluminum oxide. Aluminum oxide may be deposited directly or by deposition of an aluminum layer followed by oxidation. The upper and lower portions 550, 560 of the dielectric layer 540 may be composed of the same material or may be different materials. Additional layers, e.g., intermediate layers, may also be formed over the stationary layer 502. For example, in an embodiment (not shown), an intermediate layer is formed over at least a portion of the stationary layer 502, and the dielectric layer 540 is formed over the intermediate layer and over the stationary layer 502 underlying the intermediate layer. Such intermediate layer(s) formed between the stationary layer 502 and the dielectric layer 540 may be utilized for various purposes. For example, the intermediate layer may be an optical layer, a barrier layer and/or a non-conductive layer (such as a second dielectric layer). In an embodiment, in any particular dielectric layer 540, at least one of the portions 550, 560 is an electrical insulator.

The upper portion 560 may be thinner or thicker than the lower portion 550. For example, in one embodiment the upper portion 560 may have a thickness in the range of about 50 Å to about 500 Å, and the lower portion 550 may have a thickness in the range of about 200 Å to about 3000 Å. As described in greater detail below, the upper or "stop" portion 560 may serve as an etch barrier (e.g., functioning in a manner somewhat analogous to a photomask) during a later process step, and a part of the lower portion 550 may serve as a "sacrificial" layer that is removed. In this embodiment, the upper portion 560 is more resistant to removal (e.g. by etching) than the lower portion 550. In a particular embodiment, the upper portion 560 is aluminum oxide and the lower portion 550 is silicon oxide. The upper and lower portions 550, 560 need not be distinct layers and thus the dielectric layer 540 may be a graded layer. For example, the dielectric layer 540 may be compositionally graded so that the composition varies as a function of position (e.g., as a function of vertical position in FIG. 14) within the dielectric layer. For example, the dielectric layer 540 may be a graded silicon nitride layer in which the relative amounts of silicon and nitrogen vary on going from the upper surface 420, 421 to the interface 422, 423 with the first electrode layer 502 and the substrate 500. In one embodiment, for example, the graded silicon nitride layer is enriched in silicon at the interface 421 with the first electrode 502 relative to the overall composition of the graded silicon nitride. In another embodiment, the dielectric layer 540 may be a graded silicon oxide layer in which the relative amounts of silicon and oxygen vary on going from the upper surface 420, 421 to the interface 422, 423 with the first electrode layer 502 and the substrate 500. In one embodiment, for example, the graded silicon oxide layer is enriched in silicon at the interface 421 with the first electrode 502 relative to the overall composition of the graded silicon oxide.

Figure 15:
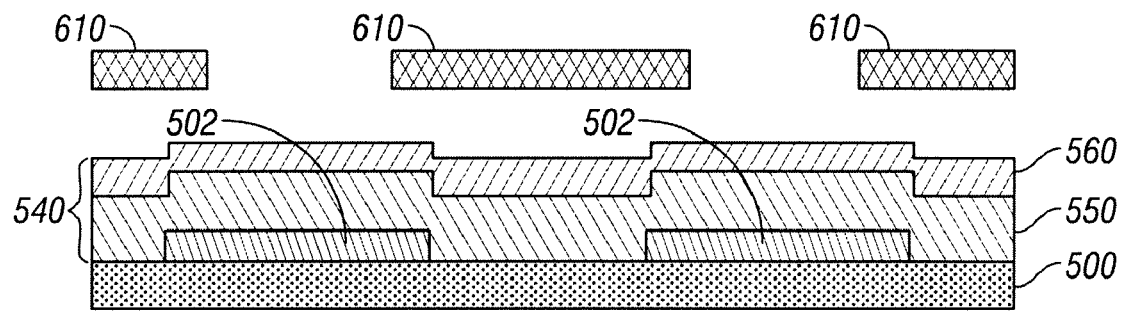
FIGS. 15 and 16 are cross-sectional views schematically illustrating the formation of a variable thickness dielectric layer 570 (including "stops" 565) on the stationary layer 502 of FIG. 13 by removing parts of the upper portion 560 of dielectric layer 540 of FIG. 14.
Figure 16:
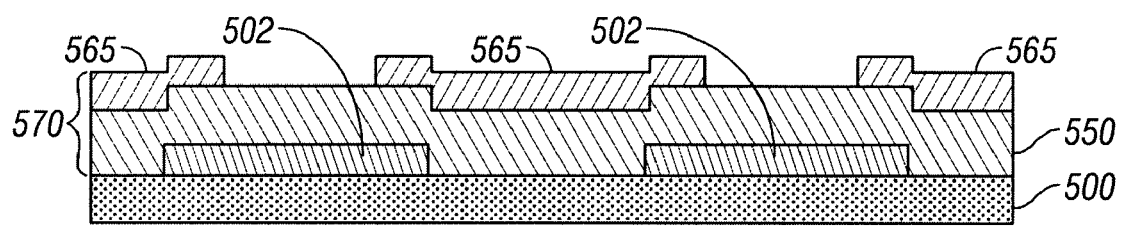

FIG. 15 shows that parts of the upper portion 560 are then removed to form "stops" 565 by masking the upper portion 560 with a photomask 610, then etching to selectively remove the exposed part of the upper portion 560 of the dielectric layer 540 to form a variable thickness dielectric layer 570 as illustrated in FIG. 16. The etching is carried out to expose part of the lower portion 550 of the dielectric layer 540. The etching is controlled so that a substantial portion of the lower portion 550 of the dielectric layer 540 remains. For example, a small part of the lower portion 550 may be removed during etching, but most of the lower portion 550 preferably remains until it is removed during subsequent processing as described below, thereby increasing the unevenness of the dielectric layer and increasing the average peak-to-valley surface variation of the dielectric layer.

Figure 17:
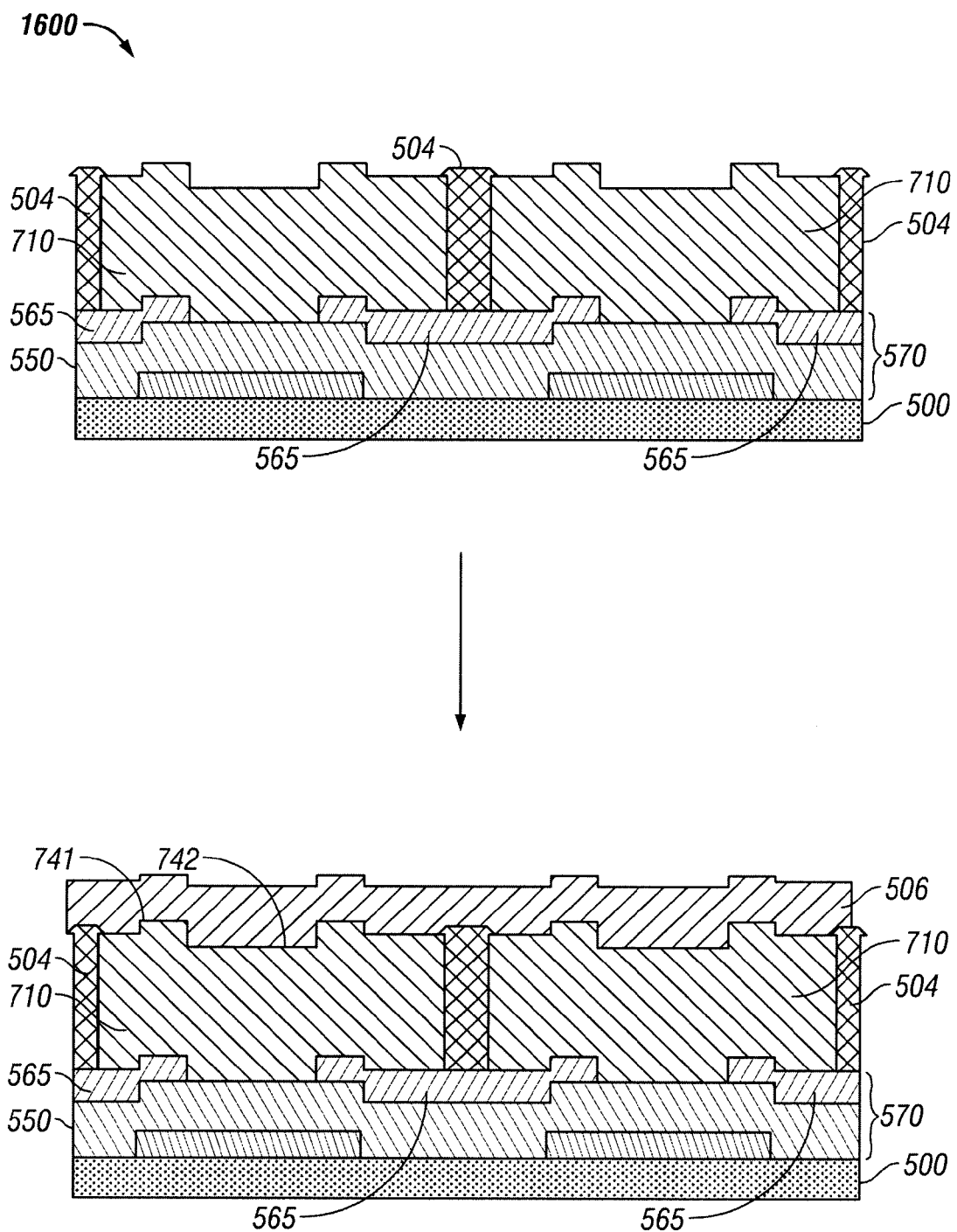
FIG. 17 is cross-sectional views schematically illustrating the formation of a sacrificial layer 710, support structures 720, and an upper electrode 730 of an interferometric modulator.

The fabrication process continues as illustrated in FIG. 17, including formation of a sacrificial layer 710 (which is later removed to form the interferometric cavity 418) by deposition, patterning and etching; formation (and optional planarization) of the posts 504; and formation of the deformable layer 506 by deposition, patterning and etching. Sacrificial layer 710 is preferably molybdenum. In an embodiment, the deformable layer 506 is an upper electrode. Because these steps are carried out over variable thickness dielectric layer 570, the interface between sacrificial layer 710 and deformable layer 506 may not be completely flat. For example, in the illustrated embodiment, the lower surface contour 741, 742 of the deformable layer 506 tends to substantially parallel the contours of the layers beneath it, e.g., the steps in the variable thickness dielectric layer 570. However, those skilled in the art will understand that variable thickness dielectric layer 570 may have a thickness of only 100 Å, and thus FIG. 17 (not to scale) may exaggerate the undulations in the lower contour 741, 742.

Figure 18:
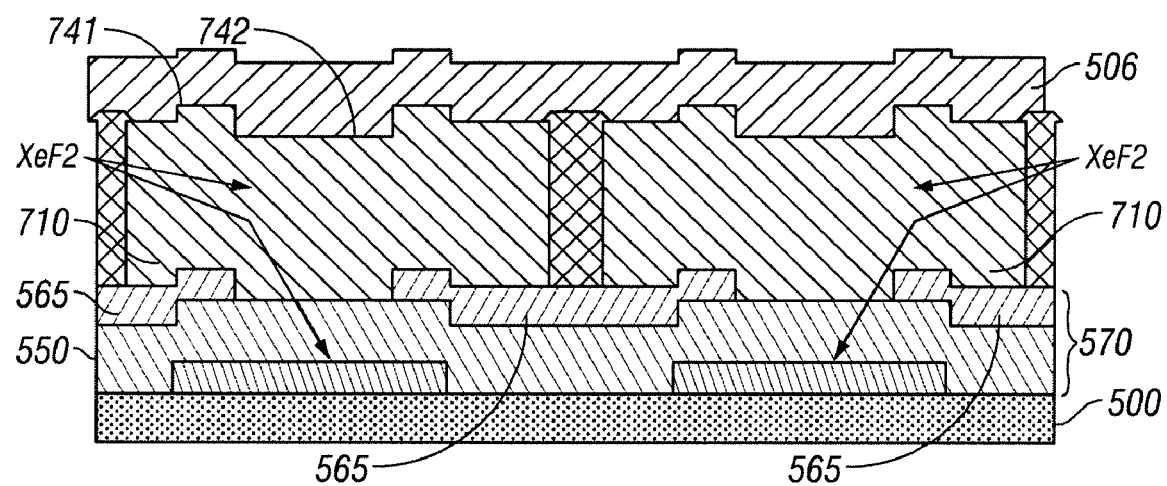
FIG. 18 is a cross-sectional view schematically illustrating the removal of the sacrificial layer 710 and the removal of parts of the lower portion 550 of the dielectric layer 570 of FIG. 17.

FIG. 18 illustrates etching with an etchant to remove the "sacrificial" layers, sacrificial layer 710 and the exposed part of the lower portion 550. As the etchant, $XeF_2$, $F_2$ or HF may be used alone or in combination. The upper or "stop" portion 565 substantially protects the part of the lower portion 550 that is beneath it from being removed by etching, functioning in a manner somewhat analogous to a photomask. The resulting interferometric modulator 1800 illustrated in FIG. 19 includes the interferometric cavity 418, a portion 910 of the stationary layer 502 that is not covered by a variable thickness dielectric layer 920 (comprising the upper variable thickness dielectric layer 565 and a variable thickness lower portion 925). The lower portion 550 need not be completely removed by etching, and thus part of the lower portion 550 may remain over the stationary layer 502, preferably where the stationary layer 502 is a single conductor layer.

This invention is not limited by theory, but it is believed that $XeF_2$ serves as a convenient source of $F_2$ gas. Other etchants such as $F_2$ and HF may be used in place of or in addition to $XeF_2$. In an embodiment, the etchant removes the lower portion 550 at an etch rate that is higher than an etch rate for removing the upper portion 565. Thus, in an embodiment, the difference in average thickness variation between the lower surface contour 741, 742 of the deformable layer 506 and the upper contour of the variable thickness dielectric layer 570 tends to increase as etching proceeds, e.g., as the variable thickness dielectric layer 570 is etched to form the variable thickness dielectric layer 920.

The variable thickness dielectric layer 920 comprises landing pads 513. The landing pads 513 project upward from the stationary layer 502 and substantially prevent contact between the stationary layer 502 and the deformable layer 506, during both the driven and undriven states. The variable thickness dielectric layer may be a discontinuous layer, e.g., as illustrated by dielectric layer 920 in FIG. 19, or may be a continuous layer in which the thickness variation is manifested as peaks and valleys on the surface of the layer.

It will be appreciated by those skilled in the art that the variable thickness dielectric layer 920 may comprise multiple columns of dielectric material that project upward from the bottom electrode and substantially prevent contact between the first and second electrode, during both the driven and undriven states, e.g., as illustrated in FIG. 12. Thus, the remaining surface area of the bottom electrode (e.g., the surface portion 910 not covered by such a column) need not be coated or covered by an insulating layer. A substantial improvement in capacitance is thus obtained, because the dielectric constant of air (about 1) is lower than that of insulating materials such as metal oxides disclosed in U.S. Pat. No. 5,835,255. The variable thickness dielectric layer may be a discontinuous layer, e.g., as illustrated by dielectric layer 920 in FIG. 15, or may be a continuous layer in which the thickness variation is manifested as peaks and valleys on the surface of the layer. In either case, the distance between the top of the landing pad 513, for example, and the bottom of the valley or gap 910, for example, is preferably about 50 Å or greater, more preferably in the range of about 100 Å to about 3,000 Å.

Those skilled in the art will appreciate that, in the illustrated embodiment of FIG. 18, the upper or "stop" portion 565 that is patterned above the lower or "bulk" portion 550 prevents the bulk layer from being completely etched away by the $XeF_2$ (similar to any masking step used to pattern previous layers). The areas of the bulk layer 550 that are not protected by the stop portion 565 form a sacrificial portion that is later removed, and the portions of the bulk material 925 below the stop 565 remain, forming a variable thickness dielectric layer 920 (comprising an upper layer 565 and a lower layer 925), e.g., comprising one or more islands or columns of multilayer dielectric material that substantially prevent contact between the first and second electrodes. Although the lower contour 741, 742 of the underside of the deformable layer 506 illustrated in FIG. 18 tends to substantially parallel the upper contour of the variable thickness dielectric layer 570, it does not substantially parallel the upper contour of the variable thickness dielectric layer 920 illustrated in FIG. 19 because etching removes at least a part of the lower portion 550 that is not protected by the upper portion 565 of the variable thickness dielectric layer 570. This etching to remove the exposed part of the lower portion 550 creates extra space between the lower contour 742 of the deformable layer 506 and the surface portion 910 of the stationary layer 502.

Figure 19:
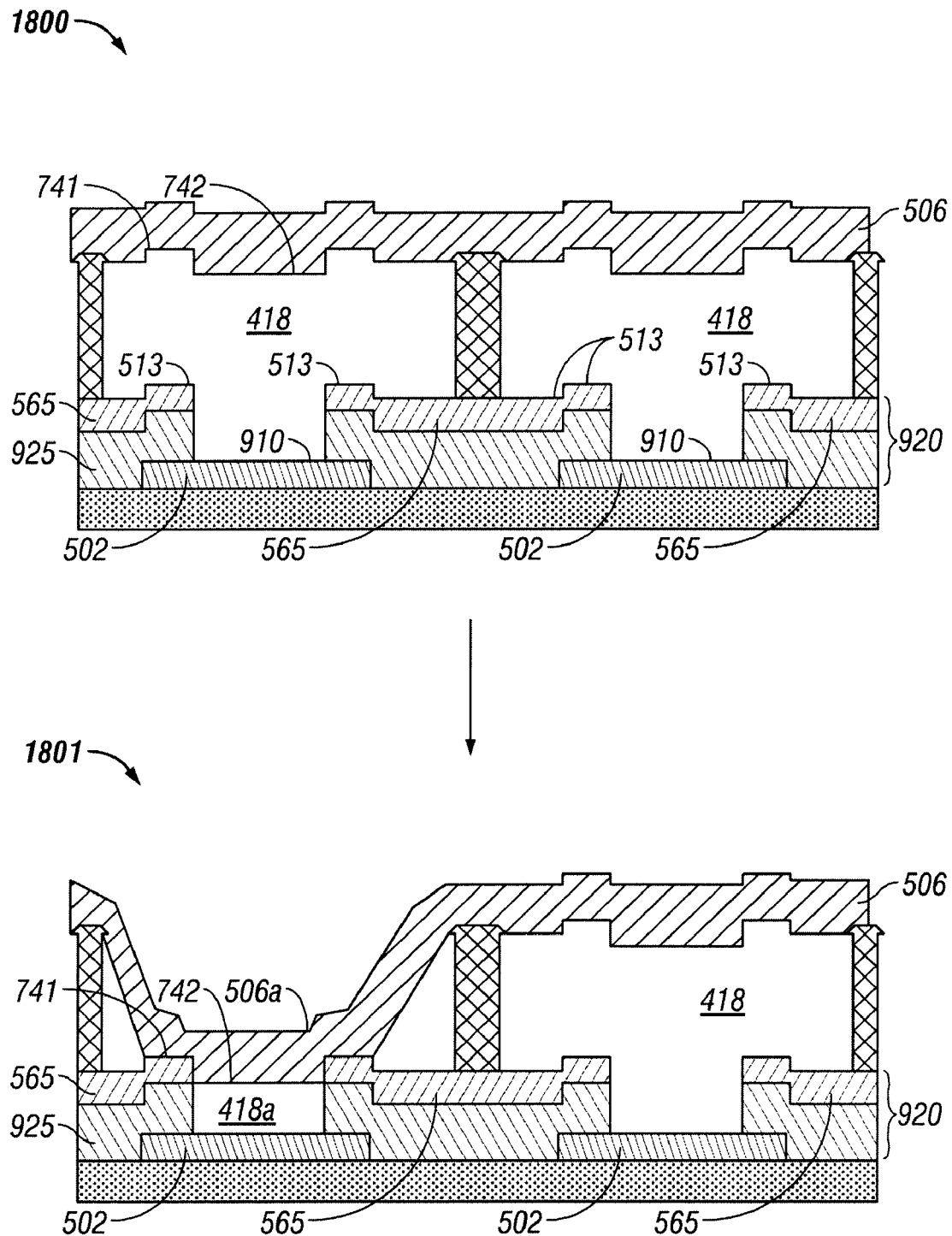
FIG. 19 shows cross-sectional views schematically illustrating an interferometric modulator 1800 comprising a stationary layer 502, a deformable layer 506, and a variable thickness dielectric layer 920 that substantially prevents contact between the first electrode 502 and the second electrode 506.

FIG. 19 illustrates an actuated interferometric modulator 1801. During actuation, the lower contour 741 of the actuated deformable layer 506a may contact the top of the stops 565, e.g. at the landing pads 513 in the illustrated embodiment, thereby creating regions in which the lower contour 741 of the deformable layer 506 is spaced from the surface portion 910 of the lower electrode 502. These regions include a low dielectric constant gap 418a between the lower contour 742 of the actuated deformable layer 506a and the surface portion 910 of the stationary layer 502. Thus, as illustrated in FIG. 19, the profile of the underside of the actuated deformable layer 506a is different from the profile of the upper side of the variable thickness dielectric layer 920, so that the low dielectric constant gap 418a exists between the actuated deformable layer 506a and the stationary layer 502 during operation. Thus, the lower surface of the deformable layer 506 has a surface profile variation 741, 742 that is less than a surface profile variation of the variable thickness dielectric layer 920. In certain embodiments, the surface profile variation is equal to the average peak-to-valley surface profile variation. The average peak-to-valley surface profile variation of the lower surface of the upper electrode may be in the range of about 50 Å to about 200 Å. The average peak-to-valley surface profile variation of the variable thickness dielectric layer may be in the range of about 200 Å to about 1000 Å. Average peak-to-valley surface profile variation may be determined by scanning electron microscopy and/or atomic force microscopy. In certain embodiments, the average peak-to-valley surface profile variation is the difference between the average peak heights and the average valley depths of the layer over a selected area.

It will be recognized that the landing pads 513 are examples of members having an upper surface located between the deformable layer 506 and the stationary layer 502. The landing pads 513 define a gap region 418a between the deformable layer 506a and the stationary layer 502 when the interferometric modulator 1801 is in the driven state (FIG. 19). The lower surface contour 742 of the deformable layer 506a in the gap region 418a does not contact either the stationary layer 502 or the landing pads 513.

Figure 20:
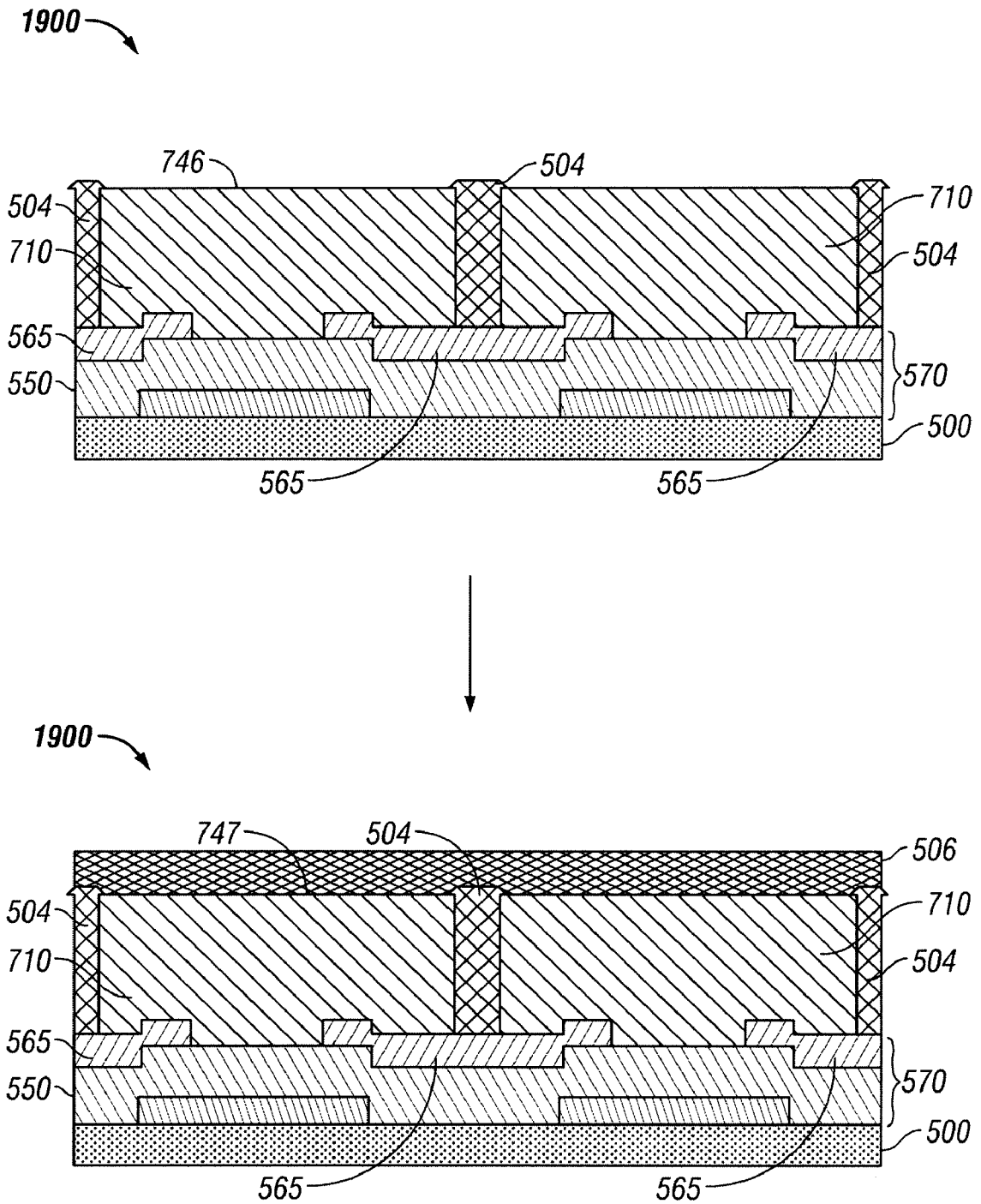
FIG. 20 shows cross-sectional views schematically illustrating the formation of a sacrificial layer 710, support structures 720, and an upper electrode 731 of an interferometric modulator.
Figure 21:
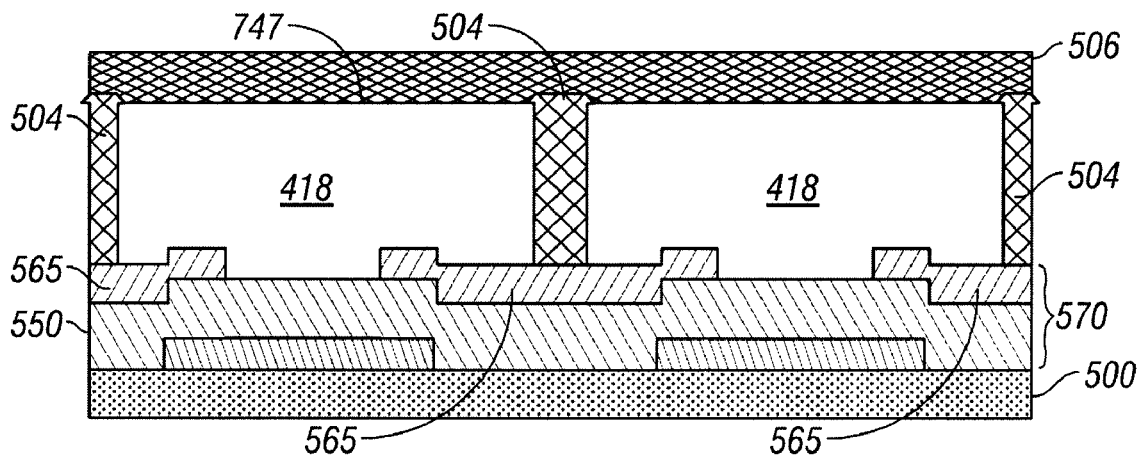
FIG. 21 is a cross-sectional view schematically illustrating an interferometric modulator.

FIG. 20 illustrates another embodiment in which the sacrificial layer is planarized before deposition of the upper electrode. The structure 1900 illustrated in FIG. 20 may be formed from the structure 1600 illustrated in FIG. 17 by planarizing the sacrificial layer 710 to produce a relatively planar surface 746. In an alternative embodiment (not illustrated), the relatively planar surface is formed by depositing a planarization layer over the sacrificial layer 710, instead of or in addition to planarizing the sacrificial layer 710. A deformable layer 506 is then formed over the surface 746 as illustrated in FIG. 16. In an embodiment, the deformable layer 506 is an upper electrode. The sacrificial layer 710 may then be removed to form a gap 418 as illustrated in FIG. 21 in a manner generally similar to that illustrated in FIG. 18. Removal of the part of the lower portion 550 that is not protected by the upper portion 565 of the variable thickness dielectric layer 570 (as illustrated in FIG. 18) is optional for the configuration illustrated in FIGS. 20-21 because the lower contour 747 of the deformable layer 506 is relatively planar. Thus, the profile of the underside of the deformable layer 506 is different from the profile of the upper side of the variable thickness dielectric layer 570 (regardless of whether the part of the lower portion 550 that is not protected by the upper portion 565 of the variable thickness dielectric layer 570 is removed or not) so that a low dielectric constant gap(s) exists between the upper deformable layer 506 and lower stationary layer 502 during operation. Thus, the lower contour 747 of the deformable layer 506 has a surface profile variation that is less than a surface profile variation of the variable thickness dielectric layer 570.

In the illustrated embodiments, the variable thickness dielectric layer 920 is formed over the stationary layer 502 (in this context, "over" refers to the relative location for the orientation illustrated in FIG. 19). A variable thickness dielectric layer may be formed elsewhere in the cavity 418, e.g., under the deformable layer 506. Thus, for example, a variable thickness dielectric layer may be formed on the first electrode and/or on the second electrode of an interferometric modulator. Those skilled in the art will also appreciate that an interferometric modulator may contain three or more electrodes, and thus may contain two or more variable thickness dielectric layers, e.g., a variable thickness dielectric layer between each of the electrodes.

In the illustrated embodiment, portions of the cavity may contain a low dielectric constant material, e.g., some or all of the interior walls of the cavity 418 may optionally be coated or covered with a low dielectric constant material. For example, after etching to form the interferometric modulator illustrated in FIG. 19, a layer of low dielectric constant material (not shown) may be formed on the surface portion 910 of the stationary layer 502. Preferably, any such layer of low dielectric constant material is relatively thin, such that a gap remains between the top electrode and the low dielectric constant material during both the driven and undriven states. Other interior walls of the cavity 418 that may coated with a low dielectric constant material include the deformable layer 506 (which may be an upper electrode) and the variable thickness dielectric layer 565.

Silicon dioxide has a dielectric constant of approximately 3.8. Preferred low dielectric constant materials have a dielectric constant less than that of silicon oxide, i.e., less than 3.8. Exemplary materials compatible with embodiments described herein include, but are not limited to, porous dielectric materials (e.g., aerogels) and modified silicon oxides. See, e.g., U.S. Pat. Nos. 6,171,945 and 6,660,656, both of which describe low dielectric constant materials and methods for making them which are compatible with embodiments described herein. Preferred low dielectric constant materials have a dielectric constant of about 3.3 or less, more preferably about 3.0 or less, and most preferably about 2.0 or less.

In another embodiment (not illustrated), a variable thickness dielectric layer is formed by depositing a dielectric layer having a relatively uniform thickness on the first and/or second electrodes (e.g., over the stationary layer 502 as shown in FIG. 13), then continuing the fabrication process as shown in FIGS. 14-16 but without the masking step shown in FIG. 15. Then, during subsequent etching (e.g., as illustrated in FIGS. 18-19), the flow of the etchant is controlled so that the dielectric layer having a relatively uniform thickness is etched to a greater extent in some areas than others, resulting in a variable thickness dielectric layer.

It will be appreciated by those skilled in the art that a variable thickness dielectric layer, e.g., comprising multiple columns of dielectric material that project upward from the bottom electrode, may also reduce damping of the interferometric modulator during operation, and thus may provide increased device switching speed by facilitating escape of the damping medium (e.g., air) from the cavity. It will also be appreciated that the variable thickness dielectric layer has a reduced dielectric constant as compared to a comparable uniform thickness dielectric layer of the same overall thickness as the variable thickness dielectric layer. The reduced dielectric constant may advantageously reduce the RC time constant of the interferometric device into which it is incorporated, based on the relationship time =resistance ×capacitance, thus increasing device switching speed. Certain embodiments provide an interferometric modulator made by a process described herein, wherein the interferometric modulator comprises a variable thickness dielectric layer. Such an interferometric modulator may have a lower capacitance than a comparable interferometric modulator having a uniform thickness dielectric layer in place of the variable thickness dielectric layer. Such an interferometric modulator may also have increased performance (e.g., increased switching speed resulting from reduced damping and/or from a reduced RC time constant) than a comparable interferometric modulator having a uniform thickness dielectric layer in place of the variable thickness dielectric layer. It will also be appreciated that use of a variable thickness dielectric layer as described herein may result in reduced contact area between moving parts of the MEMS device, e.g., a reduced contact area between the dielectric layer and the movable electrode. This reduction in contact area may result in increased mechanical reliability and/or reduced wear. Electrical reliability may also be improved by use of a variable thickness dielectric layer that results in reduced electrical contact area with the moveable electrode. Such reduced electrical contact area may result in reduced electrical charging of the dielectric layer.

Bumps

Figure 22A:
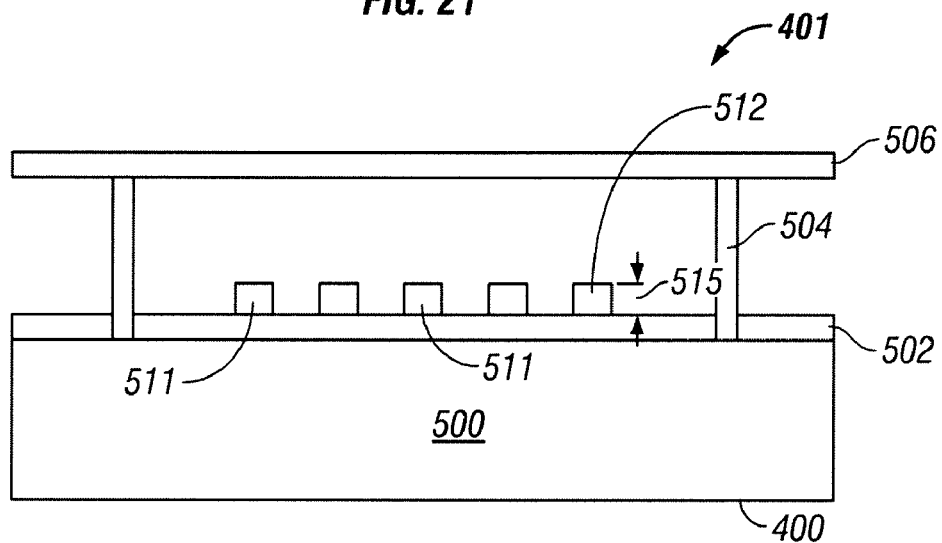
FIG. 22A is a side cross-sectional view of an embodiment of the interferometric modulator with bumps showing the modulator in the undriven state.
Figure 22B:
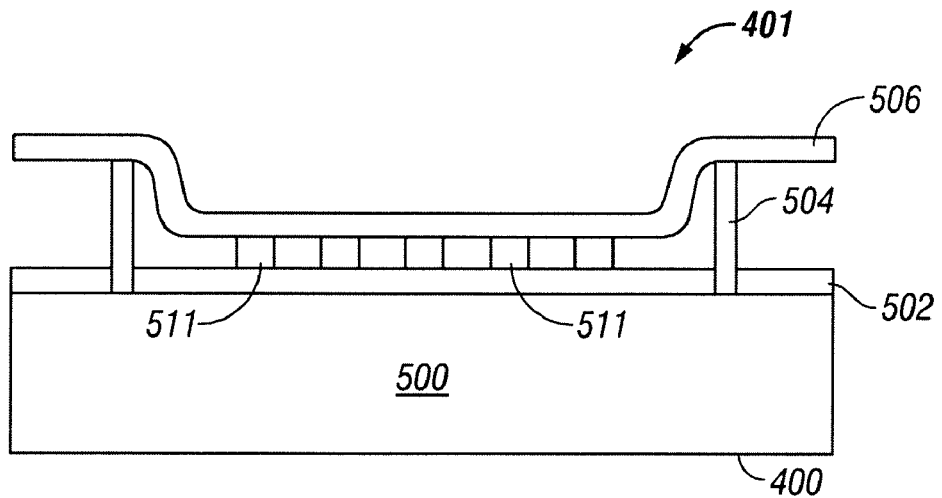
FIG. 22B is a side cross-sectional view of the embodiment of FIG. 22A in the driven state.

FIGS. 22A and 22B illustrate an embodiment of an interferometric modulator 401 that includes bumps 511. In the illustrated embodiment, a plurality of bumps 511 is formed on the top surface of the stationary layer 502. Accordingly, when the interferometric modulator 401 is driven from its undriven state (FIG. 22A) to the driven state (FIG. 22B), the deformable layer 506 contacts the bumps 511, which act to prevent or minimize the physical contact between the deformable layer 506 and the stationary layer 502. Further, with the existence of the bumps, the area of contact between the deformable layer 506 and the stationary layer 502 can be reduced.

As discussed above with reference to FIGS. 9A and 9B, the stationary layer 502 includes at least one conductive layer but can be formed of a single layer or multiple layers. In any of the constructions of the stationary layer 502, the bumps 511 are preferably located on the top surface of the stationary layer 502. In one embodiment, the top surface is made of a dielectric material and the bumps 511 are located on the dielectric surface. In another embodiment, the top surface of the stationary layer 502 is made of a conductive layer, and the bumps 511 are located on the conductive surface.

Figure 22C:
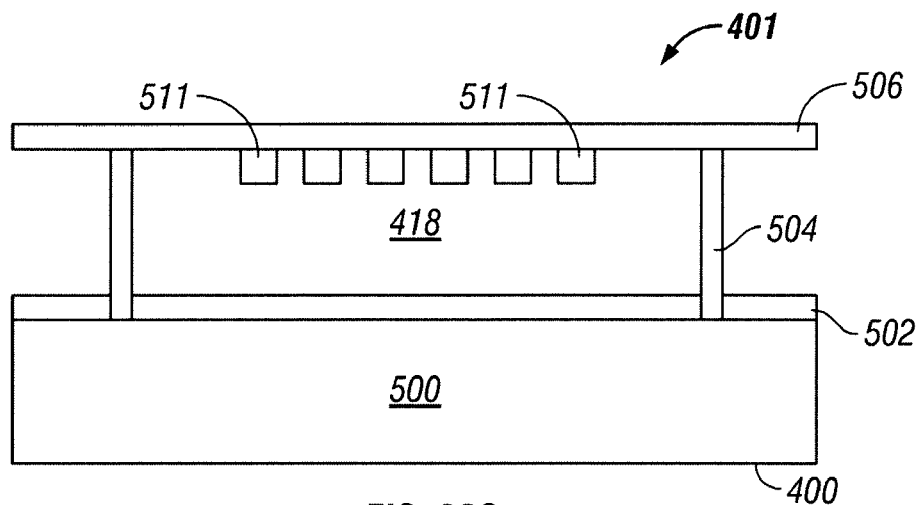
FIGS. 22C-22E are side cross-sectional views of embodiments of the interferometric modulator illustrating various configurations of bumps.
Figure 22D:
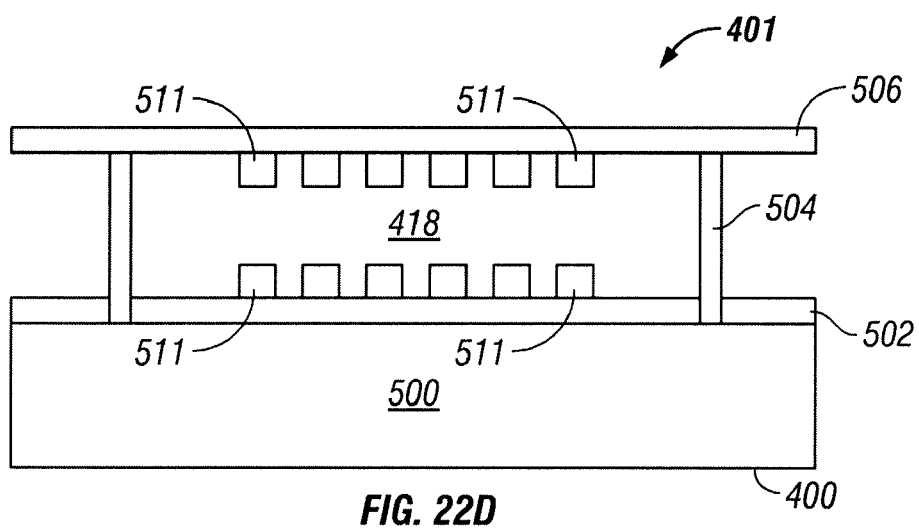

In another embodiment as illustrated in FIG. 22C, the bumps 511 may be located on the deformable layer 506 or mirror 419 (not shown). Again, the deformable layer 506 (or mirror 419) may include multiple sub-layers. In any of the constructions, the bumps 511 are preferably located on the surface of the deformable layer 506 (or mirror 419) facing the stationary layer 502. In another embodiment as illustrated in FIG. 22D, the bumps 511 may be located on both the deformable layer 506 and the stationary layer 502.

The plurality of bumps 511 can be positioned in various locations on the stationary layer 502 and/or the deformable layer 506 within the interferometric cavity 418. In one embodiment, the bumps 511 are located throughout the surface of the stationary layer 502 and/or the deformable layer 506. In another embodiment, the bumps 511 are located primarily on a central portion of the stationary layer 502 or the deformable layer 506. In the area where the bumps 511 are located, the bumps 511 may be regularly, sporadically or randomly arranged on the surface of the stationary layer 502 or the deformable layer 506.

Figure 22E:
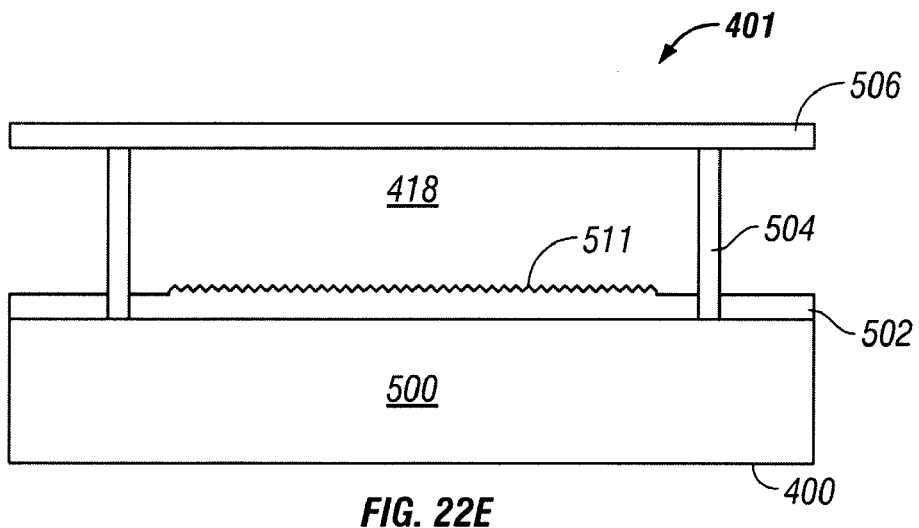

The bumps 511 may be fabricated in various shapes. In an embodiment as illustrated in FIG. 22E, the bumps 511 may not have a regular shape and may comprise irregular protrusions from the stationary layer 502 or the deformable layer 506. In other embodiments, the bumps 511 may have one or more regular shapes as illustrated in FIGS. 22A-22D. In the embodiments of regularly shaped bumps, the bumps 511 may have a distal surface 512 (FIG. 22A). In the illustrated embodiments, the distal surface 512 is substantially planar and parallel to the counterpart surface of the deformable layer 506 (or the stationary layer 502 in the embodiment of FIG. 22C or the counterpart bumps in the embodiment of FIG. 22D). In another embodiment, the distal surface 512 may be planar but tilted with reference to the counterpart surface (not illustrated). In still another embodiment, the distal surface 512 of the bumps 511 may be round or rough (not illustrated).

The bumps 511 protrude from the stationary layer 502 or the deformable layer 506 by a height indicated at 515 of FIG. 22A. The height 515 of a bump 511 is defined as the distance between the distal end (distal surface 512 in FIG. 22A) of the bump 511 and the surface from which the bump 511 protrudes. In some situations where the bumps are formed of the same material as the underlying layer and are shaped irregularly, the reference surface may be difficult to determine. In such cases, the height 515 of a bump 511 is the farthest distance between the distal end of the bump and the surface of the stationary layer 502 and/or the deformable layer 506. In some embodiments, the bumps 511 have substantially the same height 515. In other embodiments, each of the bumps 511 may have a different height.

In one embodiment, the height 515 is selected so as to prevent physical contact between the deformable layer 506 and the stationary layer 502. In another embodiment, the height 515 is selected not only to prevent such contact, but to define the depth of the interferometric cavity 418 in the driven state of the interferometric modulator 401, so as to enable production of the desired optical characteristics of the interferometric modulator 401. In the embodiments of interferometric modulator 401 for use as a display element, the interferometric cavity depth at the driven state is designed to be short enough to absorb most, if not all, of the visible light. Although not so limited, the height 515 of the bumps 511 can be substantially smaller than the height 519 of the landing pads 513. The height 511 is from about 50 Å to about 500 Å, and preferably from about 100 Å to about 200 Å.

In a unit of the interferometric modulator 401, a number of bumps 511 can be provided. As noted above, the bumps 511 are provided to prevent the stationary layer 502 and the deformable layer 506 from directly contacting each other, and also to reduce the contact area of the two layers 502 and 506. The number of the bumps 511 in a unit of the interferometric modulator 401 is determined in view of the height 515 thereof. For example, if the height 515 of the bump 511 is significantly large, only very few bumps 511 are necessary to effectively prevent the contact between the stationary layer 502 and the deformable layer 506 because it is unlikely that the deformable layer 506 in contact with the tall bumps 511 can also contact the stationary layer 502. On the other hand, when the height 515 of the bumps 511 is small, more bumps 511 may be needed.

The plurality of bumps 511 can be fabricated from various materials. In one embodiment, the bumps 511 are made of a dielectric material. If the bumps 511 extend from a dielectric surface of the stationary layer 502 or the deformable layer 506, the bumps 511 may be made of the same dielectric material. Alternatively, the bumps 511 may be formed of another dielectric material of the surface from which they extend. In another embodiment, the bumps 511 are made of a conductive material. Preferably, the materials used to form for the bumps 511 are those that do not significantly affect the electrical or optical characteristics of the interferometric modulator. For example, materials for the bumps 511 may include oxides, nitrides and oxynitrides. Preferably, the bumps 511 are substantially transparent to predetermined wavelengths of light.

The bumps 511 can be produced in a number of ways. In one embodiment, the bumps 511 are formed by the process described above for the production of landing pads 513. In one embodiment, a material is deposited over the stationary layer 502 or the deformable layer 506, and the material is etched to form the bumps 511 on the layer 502 or 506. The layer to be etched to form the bumps may comprise the same material as the top or sole layer of the stationary layer 502 or layer 506. For example an exposed $SiO_2$ layer formed over the stationary layer 502 may be etched with an etchant to produce a rough surface, thereby forming bumps 511. The etching process can be random, or the etching can be further directed into particular shapes through the use of particular etching barriers. This can allow one to control the size and shape of the bumps and create patterns which may be optimized for reducing or preventing the adverse impact created by contact of the deformable layer 506 with the stationary layer 502.

Spring Clips

FIGS. 23A-23F illustrate embodiments of an interferometric modulator 501 including spring clips 509. In typical constructions of the interferometric modulator e.g., as illustrated in FIGS. 8, 9A and 9B, the deformable layer 506 has a tension in its deformed (driven) state 501*b* and has a tendency to return to its non-deformed (undriven) state 501*c* to reduce the tension. The tension of the deformable layer 506 in its deformed state creates a mechanical restoring force that is exerted on that layer 506 in the direction away from the stationary layer 502. The deformable layer 506 returns from its deformed state 501*b* to the undeformed state 501*c* when the mechanical restoring force overcomes the attractive force created by the electrical potential applied between the deformable layer 506 and the stationary layer 502. As will be described below in detail, the spring clips 509 are provided to help the recovery of the deformable layer 506 from its driven state to the undriven state by applying an additional element of force onto the deformable layer 506 in the direction away from the stationary layer 502. When combined with the mechanical restoring force of the deformable layer 502, the additional element of force can increase the likelihood and/or speed of the return of the deformable layer 506 to the driven state when the return is desired.

Figure 23A:
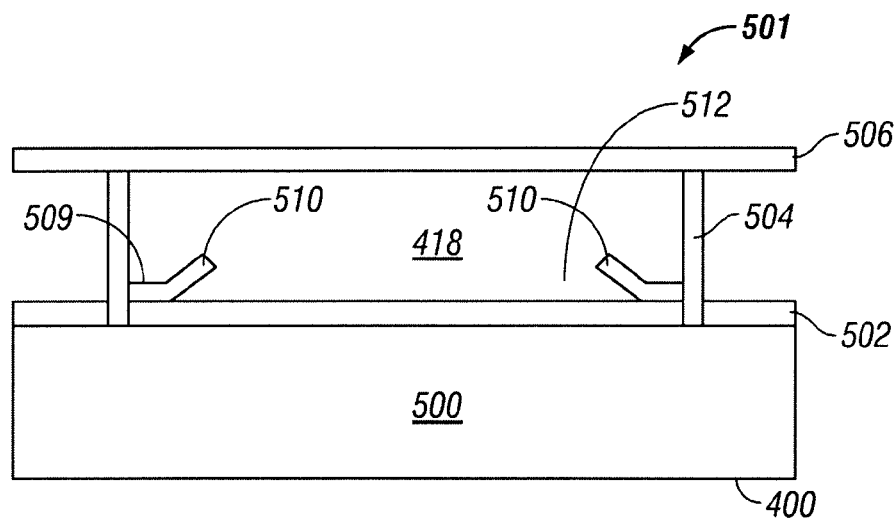
FIG. 23A is a side cross-sectional view of an embodiment of the interferometric modulator with spring clips showing the modulator in the undriven state.
Figure 23B:
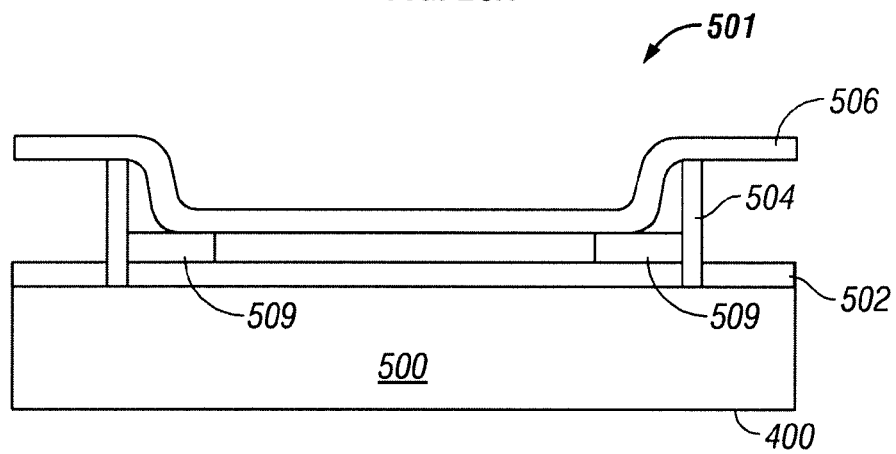
FIG. 23B is a side cross-sectional view of the embodiment of FIG. 23A in the driven state.

In the illustrated embodiment of FIGS. 23A and 23B, the spring clips 509 are provided on the stationary layer 502 of the interferometric modulator 501. Referring to FIG. 23A which illustrates the undriven state, a portion of the spring clip 509 is located on the top surface of the stationary layer 502, and the tip 510 of the spring clip 509 is bent so as to extend into the interferometric cavity 418 toward the deformable layer 506. In this undriven state, the spring clips 509 are in their normal configuration as no force is applied thereto. When this interferometric modulator 501 is driven, the deformable layer 506 deforms into the driven state illustrated in FIG. 23B. As the deformable layer 506 is deforming to its deformed state, the deformable layer 506 first contacts the tip 510 of the clips 509 and compresses the tip 510 into the substantially flat configuration as shown in FIG. 23B. The spring clips 509 in their flat configuration have a tendency to return to their normal configuration. This tendency produces a force that is exerted by the tips 510 on the deformable layer 506. When actuating the deformed layer 506 from the deformed state to its flat state, the force of the spring clips 509 exerted on the deformable layer 506 can help the actuation and increase the likelihood and/or speed of the recovery of the deformable layer 506.

Figure 23C:
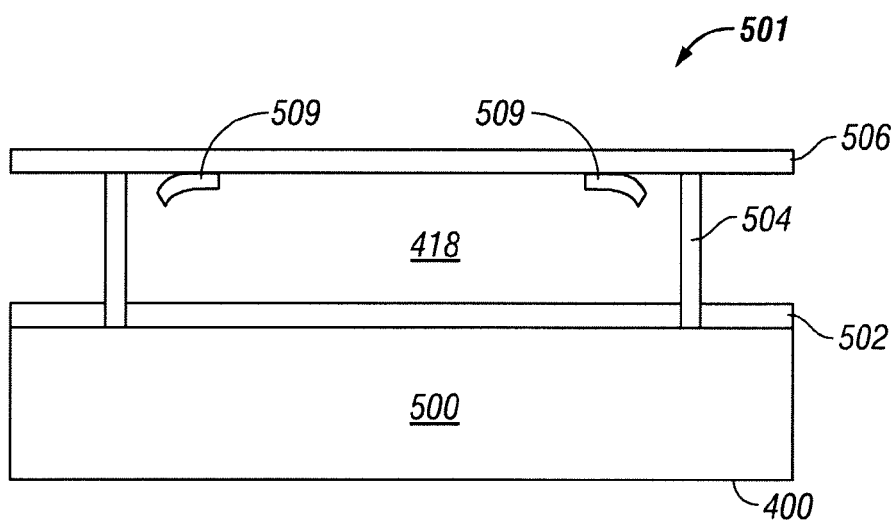
FIGS. 23C-23F are side cross-sectional views of embodiments of the interferometric modulator illustrating various configurations of spring clips.
Figure 23D:
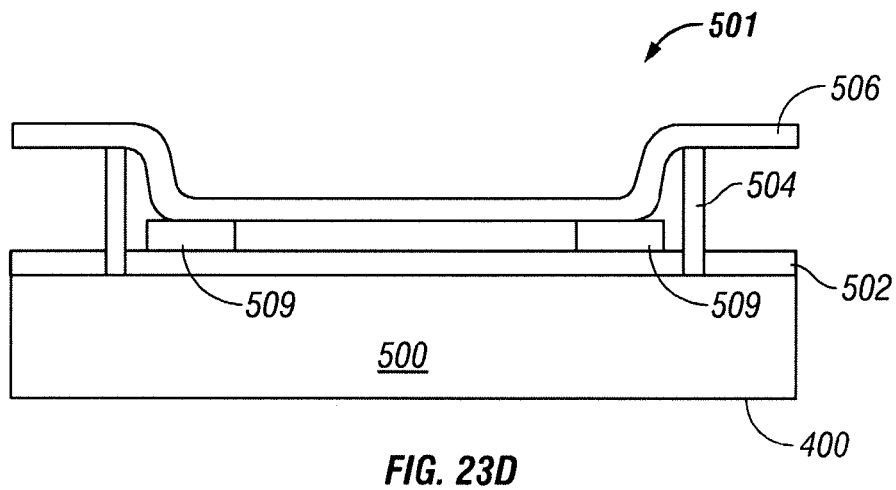

The embodiment illustrated in FIGS. 23C and 23D is the same as the embodiment of FIGS. 23A and 23B except that the spring clips 509 are formed on the deformable layer 506. In the embodiments of FIGS. 23A-23D, the spring clips 509 can also serve as the above-described landing pads and/or bumps that maintain a desired distance between the stationary layer 502 and the deformable layer 506.

Figure 23E:
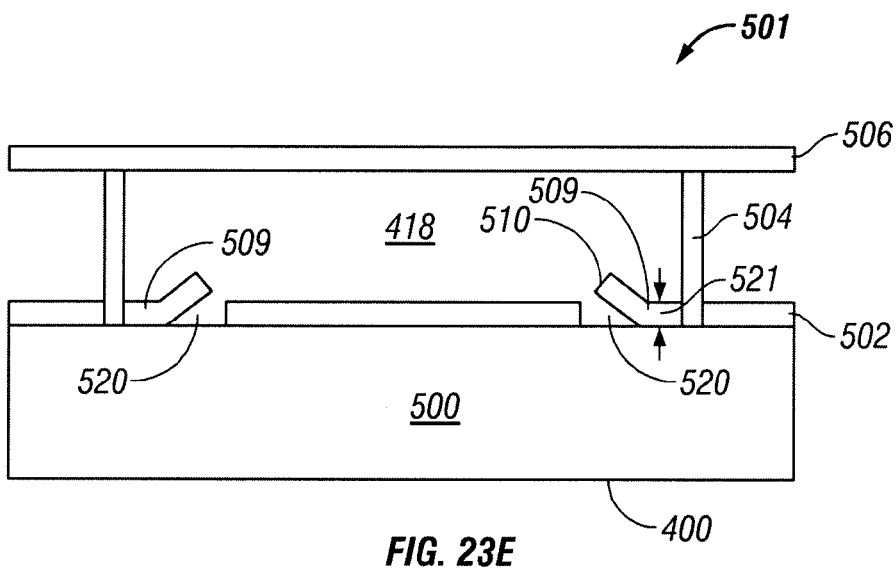
Figure 23F:
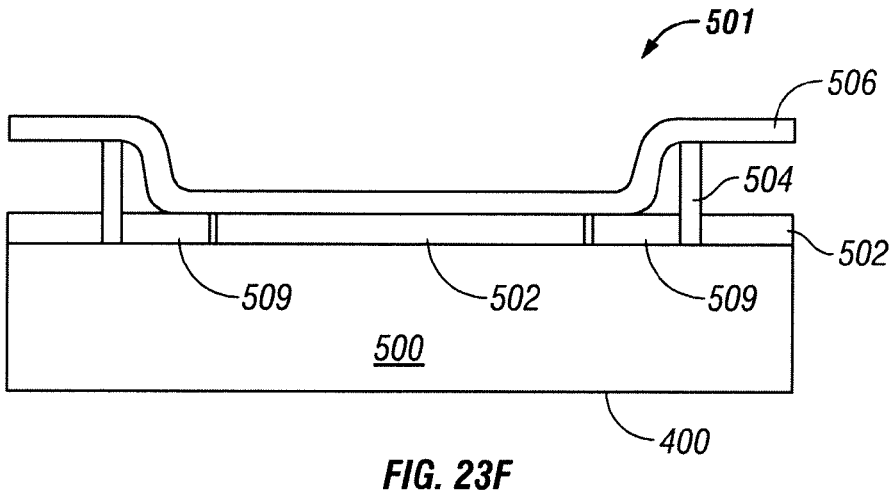

FIGS. 23E and 23F illustrate another embodiment of the interferometric modulator 501 that includes the spring clips 509. Referring to FIG. 23E which illustrates the interferometric modulator 501 in the undriven state, the stationary layer 502 has a recess 520 and the spring clip 509 has a portion contained in and attached to the recess 520. The tip 510 of the spring clip 509 is bent with respect to the portion of the clip 509 contained in the recess 520 and extends upwardly beyond the top surface of the stationary layer 502 into the interferometric cavity 418. Referring to FIG. 23F illustrating the driven state, the tip 510 of the spring clip 509 is substantially flattened by the deformable layer 506 and the stationary layer 502. Again, this tip 510 has the tendency to return to its normal configuration shown in FIG. 23E and thus exerts a force on the deformable layer 506 that is in the direction away from the stationary layer 502.

In the embodiment of FIGS. 23E and 23F, the thickness 521 of the spring clip 509 is substantially the same as or smaller than the depth of the recess 520. As a result, the deformable layer 506 contacts the top surface of the stationary layer 502 in the driven state as shown in FIG. 23F. In another embodiment, the thickness 521 of the spring clip 509 at the tip 510 and/or in the portion contained in the recess 520 may be greater than the depth of the recess 520. In such an embodiment, in the driven state of the interferometric modulator 501, the deformable layer 506 contacts the spring clip 509 particularly at the area thereof that has the thickness 521 greater than the depth of the recess 520, while not contacting the stationary layer 502. In this configuration, the spring clips 509 serve as the above-described landing pads and/or bumps as well as the spring clips 509 prevent direct contact between the stationary layer 502 and the deformable layer 506.

As will be appreciated by one of skill in the art, the spring clips 509 may not have the exact configuration as illustrated in FIGS. 23A-23F. Also, many different types of biasing mechanisms and springs may be employed in lieu of the clips 509. Additionally, materials with biasing characteristics can also be employed. For example a landing pad that includes one or more elastomeric materials may also be employed in lieu of the clips 509. For the sake of convenience, the term "spring clip" refers to any and all mechanisms having the function of exerting a force on the deformable layer 506 in the direction toward its undriven state. Although two spring clips 509 are illustrated in FIGS. 23A-23F, a single spring clip or more than two spring clips may be employed. Optionally, two or more spring clips 509 are arranged in the interferometric cavity 418 such that the forces exerted on the deformable layer 506 by the spring clips 509 are substantially balanced with one another, rather than focusing the forces on a local area of the deformable layer 506.

As will be appreciated by one of skill in the art, the size, placement and strength of the spring or biasing elements can all be varied according to the desired characteristics of the interferometric modulator. The stronger the spring, the faster and the more reliably the deformable layer 506 will return to its undriven planar position. Of course, this may also require one to adjust the initial voltage input in order to drive the interferometric modulator 501 to its fully driven state, as the deformable layer 506 will tend to have an increased amount of resistance against the spring clips 509 during its approach towards the stationary layer 502.

In some embodiments, the spring clips 509 are useful in overcoming stictional forces (static friction) that may develop when the deformable layer 506 comes in close proximity to or contacts the stationary layer 502. These forces can include Van der Waals or electrostatic forces, as well as other possibilities as appreciated by one of skill in the art. The stictional forces in nature hinder the separation of the deformable layer 506 from the stationary layer 502. Since the spring clips 509 provide additional force to separate the deformable layer 506 from the stationary layer 502, the force of the spring clips 509 can balance or overcome the stictional forces.

In some embodiments, the stictional forces between the deformable layer 506 and the stationary layer 502 can be reduced by coating the layers with a polymer that reduces static friction with or without the spring clips. For example, the layers can be coated by an anti-stiction polymer coating, which can reduce the degree of adhesion between the deformable layer 506 and the stationary layer 502. In one embodiment, this coating is applied to other aspects of the device, such as the spring clips 509, bumps 511 or landing pad 513.

As will be appreciated by one of skill in the art, the above features of landing pads 513, bumps 511 and spring clips 509 may be employed individually or may be employed together in a single embodiment. For example, an interferometric modulator may have one, two or all three of these features. Also, as described, certain features can serve both to assist in the return of the deformable layer 506 to its undriven state and to reduce the likelihood that the deformable layer 506 and the stationary layer 502 adversely contact each other, as landing pads 513 and spring clips 509 might function.

Multi-State Interferometric Modulators

Figure 24A:
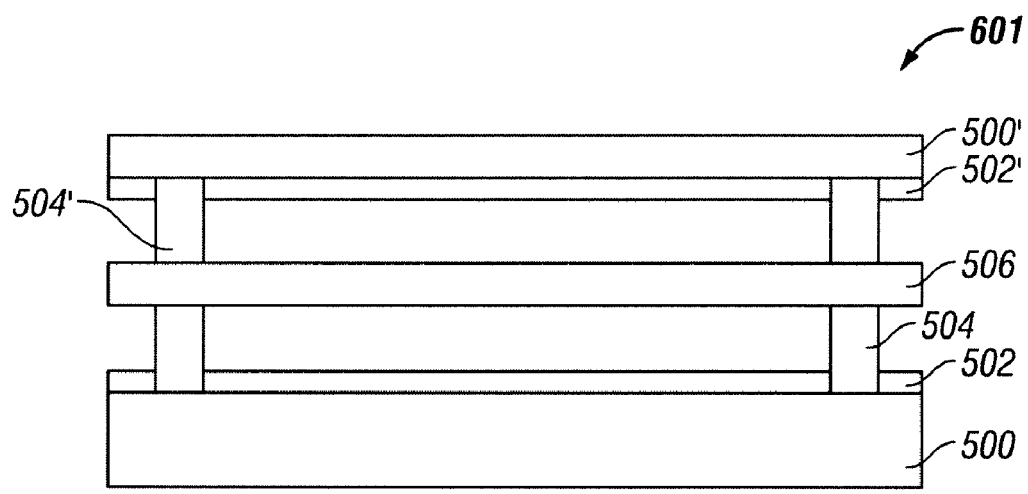
FIG. 24A is a side cross-sectional view of one embodiment of a three state interferometric modulator in the undriven state.
Figure 24B:
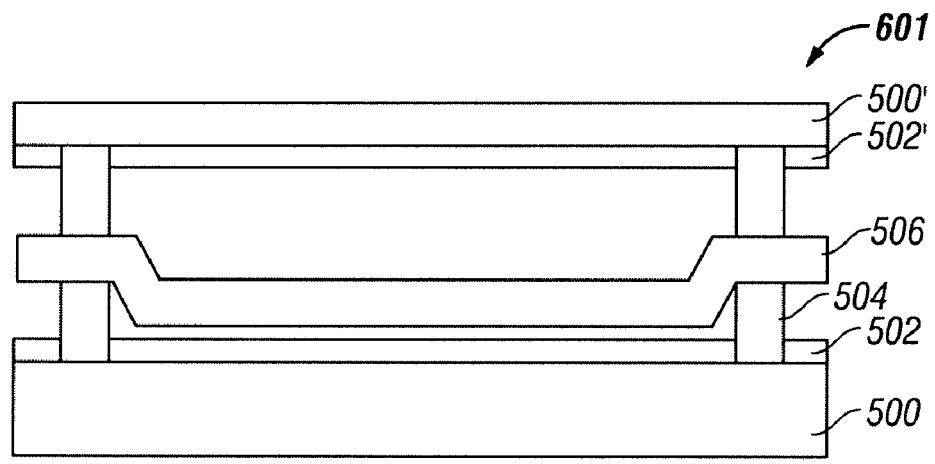
FIG. 24B is a side cross-sectional view of the three state interferometric modulator of FIG. 24A in the driven state.
Figure 24C:
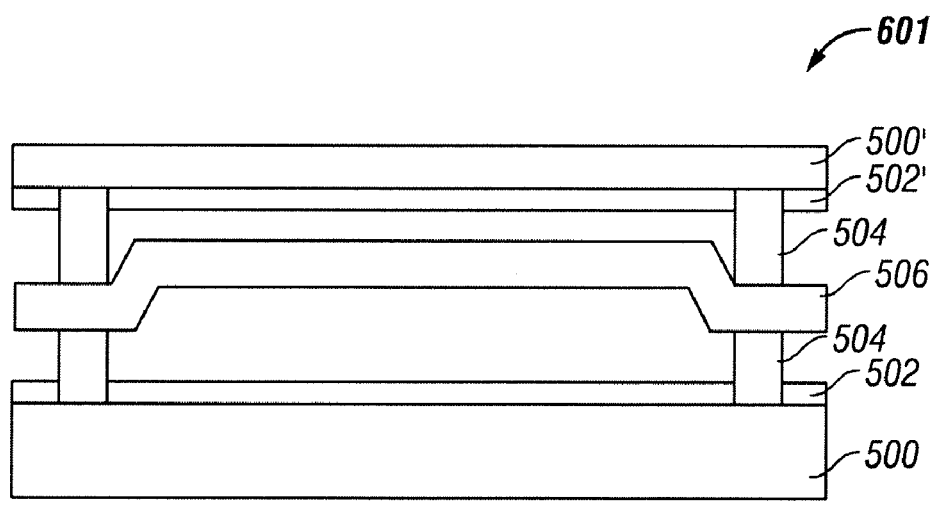
FIG. 24C is a side cross-sectional view of the three state interferometric modulator of FIG. 24A in the reverse driven state.

In some embodiments, the interferometric modulator provides more than two states (driven and undriven). An example of this is illustrated in the embodiment shown in FIGS. 24A-24C. In this embodiment, the interferometric modulator is not only capable of a deflection of the deformable layer 506 towards the layer 503, in the driven state as shown in FIG. 24B, but the interferometric modulator is also capable of reversing the direction of the deflection of layer 506 in the opposite direction, as illustrated in FIG. 24C. This "upwardly" deflected state may be called the "reverse driven state."

As will be appreciated by one of skill in the art, this reverse driven state can be achieved in a number of ways. In one embodiment, the reverse driven state is achieved through the use of an additional stationary layer 502' that can pull the deformable layer 506 in the upward direction, as depicted in FIG. 24C. In this particular embodiment, there are basically two interferometric modulators positioned symmetrically around a single layer 506. This allows each of the stationary layers 502 and 502' to attract the layer 506 in opposite directions. Thus, while an initial voltage command may send layer 506 into the normal driven state (FIG. 24B), the next voltage command can accelerate the recovery of the deformable layer 506 by driving that layer towards the reverse driven state. In this mode, the deformable layer 506 is then attracted in the opposite direction to the stationary layer 502'. In this embodiment, the stationary layers 502 and 502' may be in various constructions as described earlier in the disclosure, and do not have to be in the same construction at the same time. For example, the stationary layers 502 and 502' can be in a single layer construction or in multiple sub-layer construction. In the illustrated embodiment, a support surface 500' is maintained some distance above the deformable layer 506 through a second set of supports 504'.

As will be appreciated by one of skill in the art, not all of these elements will be required in every embodiment. For example, if the precise relative amount of upward deflection, such as that shown in FIG. 24C compared to FIG. 24A or 24B, is not relevant in the operation of the device, then the stationary layer 502' can be positioned at various distances from the deformable layer 506. Thus, there may be no need for support elements 504' or a separate substrate 500'. In these embodiments, it is not necessarily important how far upward the deflection of the deformable layer 506 extends, but rather that the stationary layer 502' is configured to attract the deformable layer 506 at the appropriate time. In other embodiments, the position of the deformable layer 506 as shown in FIG. 24C may alter optical characteristics of the interferometric modulator. In these embodiments, the precise distance of deflection of layer 506 in the upward direction can be relevant in improving the image quality of the device.

As will be appreciated by one of skill in the art, the materials used to produce the stationary layer 502' (or its sub-layers) and substrate 500' need not be similar to the materials used to produce the corresponding layer 502 and substrate 500. For example, in some embodiments, light need not pass through the layer 500' while it may be necessary for light to be able to pass through the layer 500. Additionally, if layer 502' is positioned beyond the reach of layer 506 in its deformed upward position, then a dielectric sub-layer may not be needed in the stationary layer 502' as there is little risk of layer 506 contacting the conductive portion of the layer 502'. Accordingly, the voltages applied to layers 502' and 506 can be different based on the above differences.

As will be appreciated by one of skill in the art, the voltage applied to drive the deformable layer 506 from the driven state shown in FIG. 24B to the undriven state shown in FIG. 24A, may be different from that required to drive the deformable layer 506 from the state shown in FIG. 24A to the upward or reverse driven state shown in FIG. 24C, as the distance between plates 502' and 506 is different in the two states. Thus, the amount of voltage to be applied is determined based upon the desired application and amounts of deflection.

In some embodiments, the amount of force or the duration that a force is applied between the layer 502' and the layer 506 is limited to that is necessary to merely increase the rate at which the interferometric modulator transitions between the driven state and the undriven state. Since the deformable layer 506 can be made to be attracted to either the layer 502 or 502' which are located on opposite sides of the layer 506, a very brief driving force can be provided to weaken the interaction of the layer 506 with the opposite layer. For example, as the layer 506 is driven to interact with the layer 502, a pulse of energy to the opposite layer 502' can be used to weaken the interaction of the layer 506 with the layer 502' and thereby make it easier for the deformable layer 506 to move to the undriven state.

Controlling Offset Voltages

Traditionally, interferometric modulator devices have been designed such that there is a minimum, or no, fixed electrical charge associated with each layer. However, as current fabrication techniques have not been able to achieve a "no fixed charge standard," it is frequently desirable to have the resulting fixed charge considered and compensated for when selecting the operational voltages used to control the deformable layer 506.

Through testing various configurations of layers and various deposition techniques, the amount of fixed electrical charge that is associated with each layer can be modeled and used as design criteria to select materials and layer configurations that minimize the amount of total offset voltage imparted to the interferometric modulator. For example, one or more materials can be replaced in the interferometric modulator layers to change the electrical characteristics of the overall interferometric modulator device.

Figure 24D:
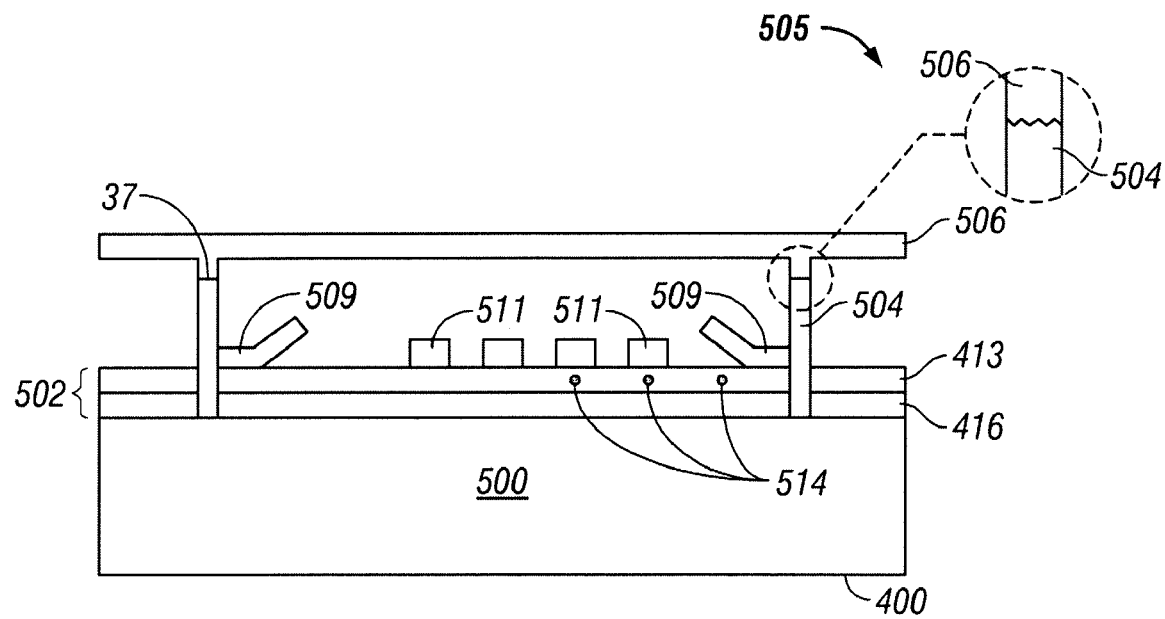
FIG. 24D is a side cross-sectional view of another embodiment of the interferometric modulator in the undriven state.
Figure 24E:
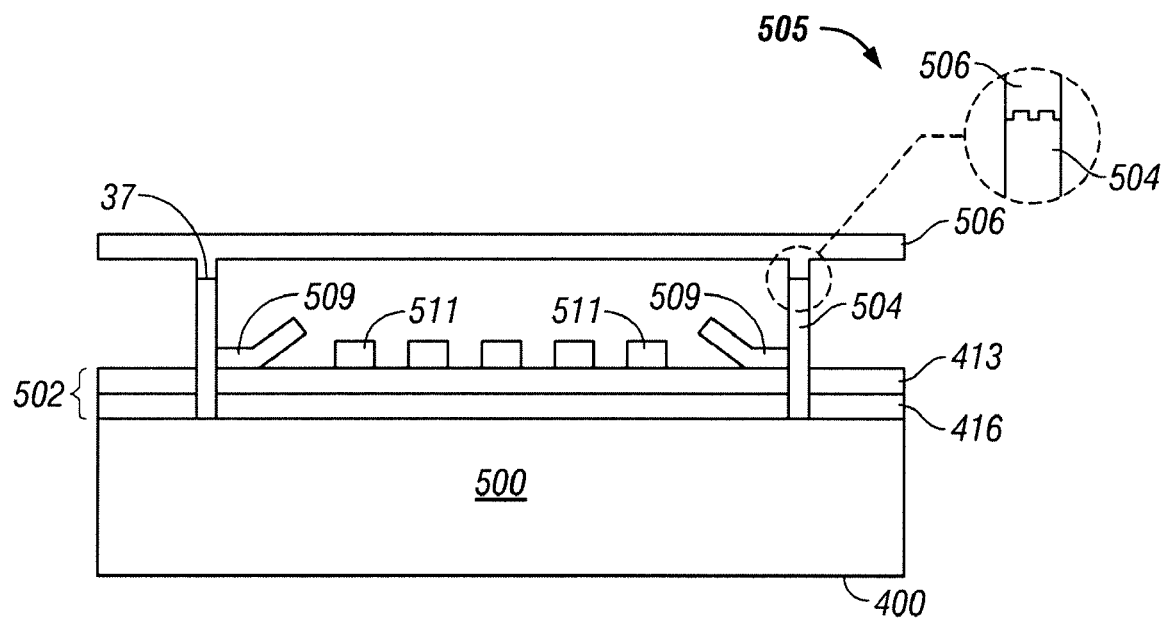
FIG. 24E is a side cross-sectional view of another embodiment of the interferometric modulator in the undriven state.

Referring now to FIG. 24D, in some embodiments, the dielectric sub-layer 413 or another sub-layer of the stationary layer 502 is modified with a charged component in order to obtain a neutrally charged system. In the illustrated embodiment, the stationary layer 502 is in a two sub-layer construction, a dielectric sub-layer 413 is located on a sub-layer 416 that serves as mirror and conductive electrode, and the dielectric sub-layer 413 contains charged components 514. Again, the stationary layer 502 can be in various constructions as described above.

The incorporation of the charged component 514 can be achieved in a number of ways. For example, additional charged components 514 can be added to the dielectric material when the dielectric sub-layer 413 is being formed on the underlying sub-layer 416. As will be appreciated by one of skill in the art, there are a variety of charged components that can be used, the amount and particular characteristics of these charged components can vary depending upon the desired properties of the interferometric modulator. Examples can include, forming a dielectric layer in a sputter tool (which can be negative) as compared to a chemical vapor deposition process (which can be positive), or altering the amount of hydrogen in the layer.

In some embodiments, the control of the amount of charged components 514 in the interferometric modulator can also be achieved through altering the method of deposition of the layers or adding entirely new layers. In another embodiment, one selects particular materials with the goal of optimizing the electrochemical characteristics of the materials. Thus, one can use various work function differences to control the final offset voltage of the interferometric modulator or change the charge accumulation rate within the device during operation of the device. For example, the deformable layer 506 can have a surface that can contact the stationary layer 502, the surface can have a high work function to minimize the transfer of electrons between the layers. In another embodiment, one can modify a sacrificial material used in the creation of the interferometric modulator so that as the sacrificial material is being removed, one is not imparting charge to the deformable layer 506 and/or the stationary layer 502. In another embodiment, materials to be used to connect the layers 502 and 506 during processing can be selected on the basis of their work function properties. In another embodiment, the material selected for the connector rod 333 (FIGS. 25A and 25B) is based on its work function characteristics.

In one embodiment, during the creation of the interferometric modulator, the stationary layer 502 and the deformable layer 506 are electrically connected so as to minimize the charge difference between the two layers. This can allow for higher yield in production and higher reliability in the final interferometric modulator. This electrical connection can be removed to allow the device to properly function. In one embodiment, this connection between the two layers is created from the same material as that from which the deformable layer 506 is created.

Reducing the Movement of the Deformable Layer 506

In some embodiments, the supports 504 interact with the deformable layer 506 through direct contact of the top end 37 of the supports 504 and the bottom surface of layer 506. In certain situations, sliding or slippage of the deformable layer 506 along the top 37 of support 504 may occur. This movement can be decreased in a number of ways. In one embodiment, the movement is decreased by altering the surface characteristics of the top 37 of the support 504. For example, one can roughen the deformable layer 506 and/or the support 504 at the point 505 where the two interact, as shown in FIGS. 24D and 249E. For example, this can be done by oxygen plasma burn down of the support or by sputter etching before the deposition of the deformable layer 506.

Alternative Forces for Driving Recovery from the Driven State

In some embodiments, the manner of deformation of the deformable layer 506 may be altered for improved functionality. In a traditional interferometric modulator 501, the deformable layer 506 is a single contiguous sheet stretched taut across the support members 504. Because the layer is stretched taut, the residual stress in the layer allows the layer to "spring" or "snap back" from the driven state to the undriven state. However, this particular arrangement can be sensitive to process variability.

Instead of relying upon the tautness of the deformable layer 506 (to create residual stress), one can instead rely upon the elastic modulus of the material, which is a constant based upon the material, rather than on primarily how the material is arranged or processed. Thus, in one aspect, the deformable layer 506 retains and provides its elasticity through a material constant of the material from which it is made. In one embodiment, this is similar to that of a cantilever spring, rather than a taut stretched film. An example of such a design is shown in FIGS. 25A-25D. FIG. 25A shows a side view, and FIG. 25B shows a top view of one embodiment of an interferometric modulator 501 in the undriven state. FIG. 25C shows a side view and FIG. 25D shows a top view of the interferometric modulator 501 in a driven state.

In this embodiment, the deformable layer 506 has been divided into two separate parts, a load bearing part 506a that is responsible for providing the flexibility and resilience for the movement of the layer through its elastic modulus, and a substantially planar part 506b, which functions as the secondary mirror for the interferometric modulator. The two parts 506a and 506b are connected to each other via a connector rod 333. In one embodiment, the connector rod 333 is made of the same material as the load bearing part 506a and/or the substantially planar part 506b. In another embodiment, the connector rod 333 is made of a material different from the load bearing part 506a and the substantially planar part 506b. In some embodiments, the connector rod 333, rather than the load bearing structure 506a, is the part that provides flexibility and resilience to the system. In some embodiments, the load bearing structure 506a is thicker than the deformable layer 506 in the previous embodiments.

As shown in FIG. 25B, the load bearing part 506a is configured in an "X" shape that is supported at its four corners 70, 71, 72, and 73 to provide its elastomeric properties. In the driven state, the load bearing part 506a bends downward and towards the stationary layer 502 through the pull from the planar part 506b of the deformable layer 506. As will be appreciated by one of skill in the art, the particular material or materials used to provide the elasticity for the system can vary depending upon the particularly desired characteristics of the system.

The above-described modifications can help remove process variability and lead to a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electromechanical device fabrication.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making a microelectromechanical system (MEMS) device, comprising:
   forming a first electrode;
   depositing a dielectric material over at least a portion of the first electrode;
   removing a portion of the dielectric material from over the first electrode, thereby forming a variable thickness dielectric layer having a thickness variation that varies across the first electrode, wherein the thickness variation is manifested as peaks and valleys with the distance between the top of the peak and the bottom of the valley being in the range of 100 Å to 3,000 Å; and
   forming a second electrode over at least a portion of the variable thickness dielectric layer.

2. The method of claim 1, further comprising depositing a sacrificial layer over at least a portion of the dielectric material.

3. The method of claim 2 in which the MEMS device comprises an interferometric modulator.

4. The method of claim 2 in which the second electrode comprises a surface facing the variable thickness dielectric layer, the surface of the second electrode facing the variable thickness dielectric layer having an average peak-to-valley surface profile variation that is less than an average peak-to-valley surface profile variation of the variable thickness dielectric layer.

5. The method of claim 1 in which the dielectric material comprises at least a first layer and a second layer.

6. The method of claim 5 in which the first layer has a first thickness that is greater than a second thickness of the second layer.

7. The method of claim 6 in which the first thickness is in the range of about 200 Å to about 3000 Å.

8. The method of claim 6 in which the second thickness is in the range of about 50 Å to about 500 Å.

9. The method of claim 5, further comprising patterning the dielectric material to define stops.

10. The method of claim 9 in which removing a portion of the dielectric material comprises removing a portion of the second layer of the dielectric material such that the stops remain.

11. The method of claim 10, further comprising depositing a sacrificial layer over at least a portion of the dielectric material.

12. The method of claim 11, further comprising removing the sacrificial layer and at least a portion of the first layer of the dielectric material.

13. The method of claim 12 in which removing the sacrificial layer and the at least a portion of the first layer of the dielectric material further comprises etching with an etchant.

14. The method of claim 13 in which etching further comprises removing the first layer of the dielectric material at a first etch rate that is higher than a second etch rate for removing the second layer.

15. The method of claim 1 in which the dielectric material is compositionally graded.

16. The method of claim 15 in which the dielectric material is a graded dielectric material selected from the group consisting of graded silicon oxide and graded silicon nitride.

17. The method of claim 16 in which the graded dielectric material at an interface with the first electrode is enriched in Si relative to the overall composition of the graded dielectric material.

18. The method of claim 1, further comprising depositing an intermediate layer over the at least a portion of the first electrode.

19. The method of claim 18 in which the intermediate layer comprises at least one of an optical layer, a barrier layer or a non-conductive layer.

20. The method of claim 18, comprising depositing the dielectric material over the intermediate layer.

21. A method of making an interferometric modulator, comprising:
   forming a first electrode;
   depositing a dielectric layer over at least a portion of the first electrode;
   removing a portion of the dielectric layer to form a variable thickness dielectric layer having a thickness variation that varies across the first electrode, wherein the thickness variation is manifested as peaks and valleys with the distance between the top of the peak and the bottom of the valley being in the range of 100 Å to 3,000 Å;
   depositing a sacrificial layer over the variable thickness dielectric layer;
   planarizing the sacrificial layer; and
   forming a second electrode over the sacrificial layer.

22. The method of claim 21 further comprising forming a planarization layer over the sacrificial layer.

23. The method of claim 21 further comprising removing the sacrificial layer.

24. The method of claim 21 in which the variable thickness dielectric layer comprises at least one stop.

25. The method of claim 21 in which the second electrode comprises a lower surface at an interface with the sacrificial layer, the lower surface of the second electrode having an average peak-to-valley surface profile variation that is less than an average peak-to-valley surface profile variation of the variable thickness dielectric layer.

26. A method of making an interferometric modulator, comprising:
   forming a first electrode;
   depositing a dielectric layer over at least a portion of the first electrode;
   removing a portion of the dielectric layer to form a variable thickness dielectric layer having a thickness variation that varies across the first electrode, wherein the thickness variation is manifested as peaks and valleys with the distance between the top of the peak and the bottom of the valley being in the range of 100 Å to 3,000 Å;
   depositing a sacrificial layer over the a variable thickness dielectric layer;
   depositing a planarization layer over the sacrificial layer; and
   forming a second electrode over the planarization layer.

27. The method of claim 26 further comprising removing the sacrificial layer.

28. The method of claim 26 further comprising planarizing the sacrificial layer.

29. The method of claim 26 in which the variable thickness dielectric layer comprises at least one stop.

30. The method of claim 26 in which the second electrode comprises a lower surface at an interface with the planarization layer, the lower surface of the second electrode having an average peak-to-valley surface profile variation that is less than an average peak-to-valley surface profile variation of the variable thickness dielectric layer.

* * * * *